US008835918B2

(12) United States Patent
Yamazaki et al.

(10) Patent No.: US 8,835,918 B2
(45) Date of Patent: Sep. 16, 2014

(54) SEMICONDUCTOR DEVICE

(75) Inventors: Shunpei Yamazaki, Setagaya (JP); Atsuo Isobe, Isehara (JP); Toshinari Sasaki, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/608,039

(22) Filed: Sep. 10, 2012

(65) Prior Publication Data

US 2013/0069053 A1   Mar. 21, 2013

(30) Foreign Application Priority Data

Sep. 16, 2011 (JP) .................. 2011-202963

(51) Int. Cl.
*H01L 29/786* (2006.01)
*H01L 27/12* (2006.01)
(52) U.S. Cl.
CPC ........ *H01L 29/7869* (2013.01); *H01L 27/1218* (2013.01); *H01L 27/1225* (2013.01)
USPC .................... 257/43; 257/E29.273
(58) Field of Classification Search
USPC ............................................. 257/43, E29.273
See application file for complete search history.

(56) References Cited

U.S. PATENT DOCUMENTS

| | | | |
|---|---|---|---|
| 4,862,237 A | 8/1989 | Morozumi et al. | |
| 5,208,476 A | 5/1993 | Inoue | |
| 5,372,958 A | 12/1994 | Miyasaka et al. | |
| 5,482,870 A | 1/1996 | Inoue | |
| 5,561,075 A | 10/1996 | Nakazawa | |
| 5,583,366 A | 12/1996 | Nakazawa | |
| 5,614,730 A | 3/1997 | Nakazawa et al. | |
| 5,731,856 A | 3/1998 | Kim et al. | |

(Continued)

FOREIGN PATENT DOCUMENTS

| | | |
|---|---|---|
| CN | 102150247 | 8/2011 |
| EP | 1737044 A | 12/2006 |

(Continued)

OTHER PUBLICATIONS

Morosawa et al., "35.3: Distinguished Paper: A Novel Self-Aligned Top-Gate Oxide TFT for AM-OLED Displays," SID Digest '11: SID International Symposium Digest of Technical Papers, May 17, 2011, pp. 479-482.

(Continued)

*Primary Examiner* — Matthew W Such
*Assistant Examiner* — Monica D Harrison
(74) *Attorney, Agent, or Firm* — Eric J. Robinson; Robinson Intellectual Property Law Office, P.C.

(57) ABSTRACT

To provide a transistor which includes an oxide semiconductor and is capable of operating at high speed or a highly reliable semiconductor device including the transistor, a transistor in which an oxide semiconductor layer including a pair of low-resistance regions and a channel formation region is provided over an electrode layer, which is embedded in a base insulating layer and whose upper surface is at least partly exposed from the base insulating layer, and a wiring layer provided above the oxide semiconductor layer is electrically connected to the electrode layer or a part of a low-resistance region of the oxide semiconductor layer, which overlaps with the electrode layer.

14 Claims, 14 Drawing Sheets

(56) References Cited

U.S. PATENT DOCUMENTS

| | | |
|---|---|---|
| 5,744,864 A | 4/1998 | Cillessen et al. |
| 5,814,539 A | 9/1998 | Nakazawa |
| 6,087,679 A | 7/2000 | Yamazaki et al. |
| 6,136,625 A | 10/2000 | Nakazawa |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,691,666 B2 * | 4/2010 | Levy et al. .................. 438/104 |
| 7,732,819 B2 | 6/2010 | Akimoto et al. |
| 7,791,072 B2 | 9/2010 | Kumomi et al. |
| 8,003,981 B2 | 8/2011 | Iwasaki et al. |
| 8,164,090 B2 | 4/2012 | Iwasaki et al. |
| 8,384,076 B2 | 2/2013 | Park et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0029591 A1 * | 2/2005 | Yudasaka et al. ............ 257/347 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0278490 A1 * | 12/2007 | Hirao et al. .................. 257/64 |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0008645 A1 | 1/2009 | Yamazaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0059742 A1 | 3/2010 | Shieh et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117073 A1 | 5/2010 | Yamazaki et al. |
| 2010/0243994 A1 * | 9/2010 | Yoon et al. .................. 257/40 |
| 2011/0101351 A1 | 5/2011 | Yamazaki |
| 2011/0204362 A1 | 8/2011 | Akimoto et al. |
| 2011/0227062 A1 | 9/2011 | Kato et al. |
| 2011/0280061 A1 | 11/2011 | Saito et al. |
| 2012/0119212 A1 | 5/2012 | Endo et al. |
| 2012/0161121 A1 | 6/2012 | Yamazaki |
| 2012/0161122 A1 | 6/2012 | Yamazaki |
| 2012/0161123 A1 | 6/2012 | Yamazaki |
| 2012/0161124 A1 | 6/2012 | Yamazaki |
| 2012/0161126 A1 | 6/2012 | Yamazaki |
| 2012/0286260 A1 | 11/2012 | Noda et al. |
| 2012/0315730 A1 | 12/2012 | Koezuka et al. |
| 2012/0315735 A1 | 12/2012 | Koezuka et al. |
| 2013/0056727 A1 | 3/2013 | Yamade et al. |
| 2013/0069054 A1 | 3/2013 | Isobe et al. |
| 2013/0069055 A1 | 3/2013 | Yamazaki et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-076264 | 3/1990 |
| JP | 02-076264 A | 3/1990 |
| JP | 05-251705 A | 9/1993 |
| JP | 08-264794 A | 10/1996 |
| JP | 08-330593 | 12/1996 |
| JP | 08-330593 A | 12/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |

(56) References Cited

FOREIGN PATENT DOCUMENTS

| | | |
|---|---|---|
| JP | 2007-220817 | 8/2007 |
| JP | 2007-220818 | 8/2007 |
| JP | 2007-220818 A | 8/2007 |
| JP | 2010-135774 A | 6/2010 |
| JP | 2010-177431 | 8/2010 |
| JP | 2010-177431 A | 8/2010 |
| JP | 2012-502486 | 1/2012 |
| WO | WO-2004/114391 | 12/2004 |
| WO | WO-2010/028269 | 3/2010 |

OTHER PUBLICATIONS

Park et al., "High performance amorphous oxide thin film transistors with self-aligned top-gate structure," IEDM 09: Technical Digest of International Electron Devices Meeting, Dec. 7, 2009, pp. 191-194.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—$ZnO$ system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$—$ZnGa_2O_4$—$ZnO$ System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C., "Hydrogen as a Cause of Doping in Zinc Oxide,", Phys. Rev, Lett. (Physical Review Letters), and Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009. pp. 227-230, The Japan Society of Applied Physics.

Coates.D et al., "Optical Studies of the Amorphous Liquid-Cholesteric Liquid Crystal Transition:The "Blue Phase", ", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. Amoled Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

(56) References Cited

OTHER PUBLICATIONS

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Appplication,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu, or, Zn]at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys.Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B. (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

International Search Report (Application No. PCT/JP2012/073397) Dated Oct. 30, 2012.

Written Opinion (Application No. PCT/JP2012/073397) Dated Oct. 30, 2012.

\* cited by examiner

SEMICONDUCTOR DEVICE

TECHNICAL FIELD

The disclosed invention relates to a semiconductor device and a method for manufacturing the semiconductor device.

In this specification and the like, a semiconductor device refers to all types of devices which can function by utilizing semiconductor characteristics; an electro-optical device, a light-emitting display device, a semiconductor circuit, and an electronic device are all semiconductor devices.

BACKGROUND ART

A technique by which a transistor is formed using a semiconductor thin film formed over a substrate having an insulating surface has been attracting attention. The transistor is applied to a wide range of semiconductor electronic devices such as an integrated circuit (IC) and an image display device (also simply referred to as display device). A silicon-based semiconductor material is widely known as a material for a semiconductor thin film applicable to the transistor. As another material, an oxide semiconductor has been attracting attention.

For example, Patent Document 1 and Patent Document 2 disclose a technique by which a transistor is manufactured using zinc oxide or an In—Ga—Zn—O-based oxide as an oxide semiconductor and is used as a switching element or the like in a pixel of a display device.

Patent Document 3 discloses a technique by which, in a staggered transistor including an oxide semiconductor, a highly conductive oxide semiconductor containing nitrogen is provided as buffer layers between a source region and a source electrode and between a drain region and a drain electrode, and thereby the contact resistance between the oxide semiconductor and the source electrode and between the oxide semiconductor and the drain electrode is reduced.

Non-Patent Document 1 discloses a top-gate amorphous oxide semiconductor transistor in which a channel region, a source region, and a drain region are formed in a self-aligned manner.

REFERENCE

[Patent Document 1] Japanese Published Patent Application No. 2007-123861
[Patent Document 2] Japanese Published Patent Application No. 2007-096055
[Patent Document 3] Japanese Published Patent Application No. 2010-135774
[Non-Patent Document] Jae Chul Park et al., "High performance amorphous oxide thin film transistors with self-aligned top-gate structure" IEDM2009, pp. 191-194

DISCLOSURE OF INVENTION

High-speed operation of a transistor is required with an improvement in performance of a semiconductor device including a transistor. In view of the above, an object of one embodiment of the present invention is to provide a transistor which includes an oxide semiconductor and is capable of operating at high speed and a method of manufacturing the transistor. Another object of one embodiment of the present invention is to provide a highly reliable semiconductor device including the transistor and a method for manufacturing the semiconductor device.

One embodiment of the disclosed invention is a semiconductor device in which an oxide semiconductor layer including a pair of low-resistance regions and a channel formation region is provided over an electrode layer which is embedded in a base insulating layer and whose upper surface is at least partly exposed from the base insulating layer, and a wiring layer provided above the oxide semiconductor layer is electrically connected to the electrode layer or a part of a low-resistance region of the oxide semiconductor layer, which overlaps with the electrode layer. Specifically, for example, the structure described below can be employed.

According to one embodiment of the present invention, a semiconductor device includes a base insulating layer; a first electrode layer and a second electrode layer which are embedded in the base insulating layer and whose upper surfaces are at least partly exposed from the base insulating layer; an oxide semiconductor layer including a pair of low-resistance regions and a channel formation region provided between the pair of low-resistance regions, which is provided on and in contact with the first electrode layer, the second electrode layer, and the base insulating layer; a gate insulating layer provided over the oxide semiconductor layer; a gate electrode layer provided over the channel formation region with the gate insulating layer provided therebetween; an insulating layer provided over the gate insulating layer; and a first wiring layer and a second wiring layer which are electrically connected to the first electrode layer and the second electrode layer, respectively, through openings provided in the insulating layer and the gate insulating layer. In the pair of low-resistance regions, one low-resistance region is at least partly in contact with the first electrode layer and the other low-resistance region is at least partly in contact with the second electrode layer, and the channel formation region is in contact with the base insulating layer.

According to another embodiment of the present invention, a semiconductor device includes a base insulating layer; a first electrode layer and a second electrode layer which are embedded in the base insulating layer and whose upper surfaces are at least partly exposed from the base insulating layer; an oxide semiconductor layer including a pair of low-resistance regions and a channel formation region provided between the pair of low-resistance regions, which is provided on and in contact with the first electrode layer, the second electrode layer, and the base insulating layer; a gate insulating layer provided over the oxide semiconductor layer; a gate electrode layer provided over the channel formation region with the gate insulating layer provided therebetween; an insulating layer provided over the gate insulating layer; and a first wiring layer and a second wiring layer which are in contact with the first electrode layer and the second electrode layer, respectively, through openings provided in the insulating layer and the gate insulating layer. In the pair of low-resistance regions, one low-resistance region is at least partly in contact with the first electrode layer and the other low-resistance region is at least partly in contact with the second electrode layer, and the channel formation region is in contact with the base insulating layer.

According to another embodiment of the present invention, a semiconductor device includes a base insulating layer; a first electrode layer and a second electrode layer which are embedded in the base insulating layer and whose upper surfaces are at least partly exposed from the base insulating layer; an oxide semiconductor layer including a pair of low-resistance regions and a channel formation region provided between the pair of low-resistance regions, which is provided on and in contact with the first electrode layer, the second electrode layer, and the base insulating layer; a gate insulating layer provided over the oxide semiconductor layer; a gate electrode layer provided over the channel formation region with the gate insulating layer provided therebetween; an insulating layer provided over the gate insulating layer; and a first wiring layer and a second wiring layer which are in contact with the pair of low-resistance regions through openings provided in the insulating layer and the gate insulating layer. In the pair of low-resistance regions, one low-resistance region is at least partly in contact with the first electrode layer and the other low-resistance region is at least partly in contact with the second electrode layer, and the channel formation region is in contact with the base insulating layer.

In any of the above semiconductor devices, the openings provided in the insulating layer and the gate insulating layer may be provided in a region overlapping with the pair of low-resistance regions. In some cases, the thickness of the pair of low-resistance regions overlapping with the openings is smaller than the thickness of the channel formation region.

In any of the above semiconductor devices, the first electrode layer or the second electrode layer may include a region not overlapping with the oxide semiconductor layer, and the first electrode layer or the second electrode layer may be in contact with the first wiring layer or the second wiring layer in the region not overlapping with the oxide semiconductor layer.

Note that the oxide semiconductor is in a single crystal state, a polycrystalline (also referred to as polycrystal) state, an amorphous state, or the like.

In the case of an oxide semiconductor in an amorphous state, a flat surface can be obtained with relative ease, so that interface scattering of a transistor including such an oxide semiconductor at the time of operation can be reduced, and relatively high field-effect mobility can be obtained with relative ease.

In an oxide semiconductor having crystallinity, defects in the bulk can be further reduced and when the surface flatness of the oxide semiconductor is improved, field-effect mobility of a transistor including the oxide semiconductor having crystallinity can be higher than that of a transistor including an oxide semiconductor in an amorphous state. In order to improve the surface flatness, the oxide semiconductor is preferably formed over a flat surface. Specifically, the oxide semiconductor can be formed over a surface with the average surface roughness (Ra) of less than or equal to 0.15 nm, preferably less than or equal to 0.1 nm.

Note that an average surface roughness Ra is obtained by expanding arithmetic mean surface roughness, which is defined by JIS B0601: 2001 (ISO4287: 1997), into three dimensions so as to be applicable to a curved surface. Moreover, an average surface roughness Ra can be expressed as "the average value of the absolute values of deviations from a reference surface to a specific surface" and is defined by the following formula.

$$Ra = \frac{1}{S_0}\int_{y_1}^{y_2}\int_{x_1}^{x_2} |f(x, y) - Z_0| \, dx \, dy \quad \text{[FORMULA 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. The area of a rectangle which is obtained by projecting the specific surface on the xy plane is represented by $S_0$, and the height of the reference surface (the average height of the specific surface) is represented by $Z_0$. The average surface roughness Ra can be measured using an atomic force microscope (AFM).

Note that the term such as "over" in this specification and the like does not necessarily mean that a component is placed "directly on" another component. For example, the expression "a gate electrode over a gate insulating layer" does not exclude the case where a component is placed between the gate insulating layer and the gate electrode. The same applies to the term "below".

In addition, in this specification and the like, the term "electrode" or "wiring" does not limit a function of a component. For example, an "electrode" is sometimes used as part of a "wiring", and vice versa. In addition, the term "electrode" or "wiring" can also mean a combination of a plurality of "electrodes" and "wirings", for example.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes the case where components are connected through an object having any electric function. There is no particular limitation on an object having any electric function as long as electric signals can be transmitted and received between components that are connected through the object. Examples of an "object having any electric function" include an electrode and a wiring.

According to one embodiment of the present invention, a transistor which includes an oxide semiconductor and is capable of operating at high speed and a method for manufacturing the transistor can be provided.

According to one embodiment of the present invention, a highly reliable semiconductor device and a method for manufacturing the semiconductor device can be provided.

BEST MODE FOR CARRYING OUT THE INVENTION

Figure 1A:
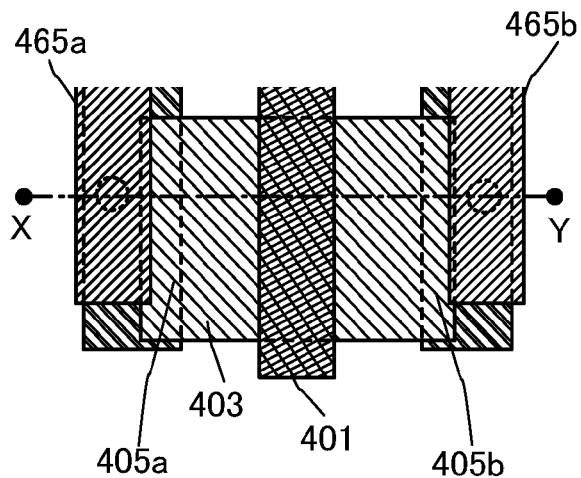
FIGS. 1A to 1C are a plan view and cross-sectional views illustrating one embodiment of a semiconductor device.

Embodiments and an example of the present invention are described below with reference to the accompanying drawings. However, the present invention is not limited to the following description, and it will be easily understood by those skilled in the art that modes and details thereof can be variously changed. Therefore, the present invention is not construed as being limited to the following description. Note that in structures of the present invention described below, like portions or portions having similar functions are denoted by the same reference numerals in different drawings, and description thereof is not repeated. Further, the same hatching pattern is applied to portions having similar functions, and the portions are not especially denoted by reference numerals in some cases.

Note that the ordinal numbers such as "first" and "second" in this specification and the like are used for convenience and do not denote the order of steps and the stacking order of layers. The ordinal numbers in this specification and the like do not denote particular names which specify the invention, either.

Embodiment 1

In this embodiment, one embodiment of a semiconductor device and a method for manufacturing the semiconductor device will be described with reference to FIGS. 1A to 1C, FIGS. 2A to 2C, FIGS. 3A and 3B, and FIGS. 4A to 4D.
<Example of Structure of Semiconductor Device>

Figure 1B:
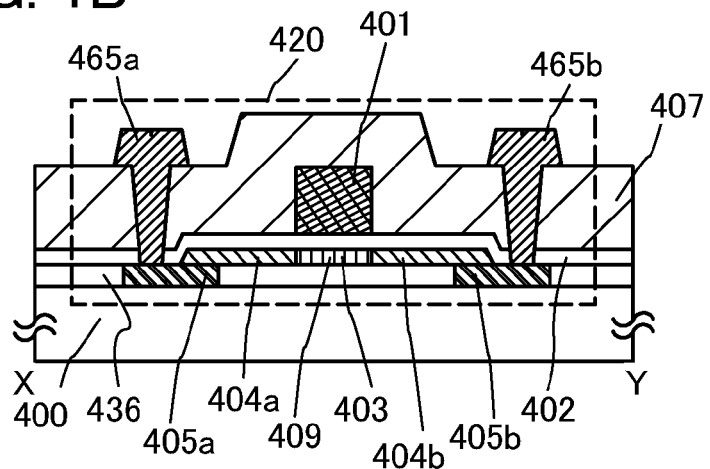

FIGS. 1A and 1B are a plan view and a cross-sectional view which illustrate a transistor 420 as an example of a semiconductor device. FIG. 1A is a plan view of the transistor 420, and FIG. 1B is a cross-sectional view taken along the line X-Y in FIG. 1A. Note that in FIG. 1A, some components of the transistor 420 (e.g., an insulating layer 407) are not illustrated for simplicity.

The transistor 420 illustrated in FIGS. 1A and 1B includes, over a substrate 400 having an insulating surface, a base insulating layer 436; an electrode layer 405a and an electrode layer 405b which are embedded in the base insulating layer 436 and whose upper surfaces are at least partly exposed from the base insulating layer 436; an oxide semiconductor layer 403 including a pair of low-resistance regions 404a and 404b and a channel formation region 409 provided between the pair of low-resistance regions 404a and 404b; a gate insulating layer 402 provided over the oxide semiconductor layer 403; a gate electrode layer 401 provided over the channel formation region 409 with the gate insulating layer 402 provided therebetween; the insulating layer 407 provided over the gate insulating layer 402; and a first wiring layer 465a and a second wiring layer 465b which are electrically connected to the electrode layer 405a and the electrode layer 405b, respectively, through openings provided in the insulating layer 407 and the gate insulating layer 402.

Further, in the oxide semiconductor layer 403 of the transistor 420, the low-resistance region 404a and the low-resistance region 404b are at least partly in contact with the electrode layer 405a and the electrode layer 405b, respectively, and the channel formation region 409 is in contact with the base insulating layer 436.

The wiring layer 465a or the electrode layer 405a electrically connected to the oxide semiconductor layer 403 can be used as a source terminal of the transistor 420. The wiring layer 465b or the electrode layer 405b electrically connected to the oxide semiconductor layer 403 can be used as a drain terminal of the transistor 420.

In this embodiment, the oxide semiconductor layer 403 is preferably a c-axis aligned crystalline oxide semiconductor (CAAC-OS) film.

The CAAC-OS film is not completely single crystal nor completely amorphous. The CAAC-OS film is an oxide semiconductor layer with a crystal-amorphous mixed phase structure where a crystal portion and an amorphous portion are included in an amorphous phase. Note that in most cases, the crystal portion fits inside a cube whose one side is less than 100 nm. From an observation image obtained with a transmission electron microscope (TEM), a boundary between an amorphous portion and a crystal portion in the CAAC-OS film is not clear. Further, with the TEM, a grain boundary in the CAAC-OS film is not found. Thus, a reduction in electron mobility due to the grain boundary is suppressed in the CAAC-OS film.

In each of the crystal portions included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and layers each including metal atoms and oxygen atoms are overlapped with each other. Note that the direction of a normal vector of the layers is a c-axis direction. Note that, among crystal portions, the directions of the a-axis and the b-axis of one crystal region may be different from those of another crystal region. In this specification, a simple term "perpendicular" includes a range from 85° to 95°. In addition, a simple term "parallel" includes a range from −5° to 5°.

In the CAAC-OS film, distribution of crystal portions is not necessarily uniform. For example, in the formation process of the CAAC-OS film, in the case where crystal growth occurs from a surface side of the oxide semiconductor layer, the proportion of crystal portions in the vicinity of the surface of the oxide semiconductor film is higher than that in the vicinity of the surface where the oxide semiconductor film is formed in some cases. Further, when an impurity is added to the CAAC-OS film, the crystal portion in a region to which the impurity is added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal portion is the direction parallel to a normal vector of the surface where the CAAC-OS film is formed or a normal vector of the surface of the CAAC-OS film. The crystal portion is formed by film formation or by performing a treatment for crystallization such as a heat treatment after film formation.

With the use of the CAAC-OS film, change in electric characteristics of the transistor due to irradiation with visible light or ultraviolet light can be reduced, so that the highly reliable transistor can be obtained.

For example, the CAAC-OS film is formed by a sputtering method with a polycrystalline oxide semiconductor sputtering target. When ions collide with the sputtering target, a crystal region included in the sputtering target may be cleaved along an a-b plane, and a sputtered particle having a plane parallel to an a-b plane (flat-plate-like sputtered particle or pellet-like sputtered particle) may separate from the sputtering target. In that case, the flat-plate-like sputtered particle reaches a substrate while maintaining their crystal state, whereby the CAAC-OS film can be formed.

For the deposition of the CAAC-OS film, the following conditions are preferably employed.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in the deposition chamber may be reduced. Furthermore, the concentration of impurities in a deposition gas may be reduced. Specifically, a deposition gas whose dew point is lower than or equal to −80° C., preferably lower than or equal to −100° C. is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Further, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the sputtering target, an In—Ga—Zn—O compound target is described below.

The In—Ga—Zn—O compound target, which is polycrystalline, is made by mixing $InO_x$ powder, $GaO_y$ powder, and $ZnO_z$ powder in a predetermined molar ratio, applying pressure, and performing a heat treatment at a temperature higher than or equal to 1000° C. and lower than or equal to 1500° C. Note that x, y, and z are each a given positive number. Here, the predetermined molar ratio of $InO_x$ powder to $GaO_y$ powder and $ZnO_z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

In the transistor 420, the pair of low-resistance regions 404a and 404b is formed in a self-aligned manner by adding an impurity element after the gate electrode layer 401 is formed, using the gate electrode layer 401 as a mask. The pair of low-resistance regions 404a and 404b can each function as a source region or a drain region of the transistor 420. With the pair of low-resistance regions 404a and 404b, the electric field applied to the channel formation region 409 between the pair of low-resistance regions 404a and 404b can be relaxed. Moreover, the electrode layer 405a and the electrode layer 405b are in contact with the low-resistance region 404a and the low-resistance region 404b, respectively, so that the contact resistance between the oxide semiconductor layer 403 and the electrode layer 405a and the electrode layer 405b can be reduced.

Further, in the transistor 420, the electrode layer 405a and the electrode layer 405b are formed using a metal material such as molybdenum, titanium, tantalum, tungsten, aluminum, copper, chromium, neodymium, or scandium; a metal nitride film which contains any of these elements (e.g., a titanium nitride film, a molybdenum nitride film, or a tungsten nitride film); or the like. Alternatively, the electrode layer 405a and the electrode layer 405b may be formed using an oxide semiconductor. Note that the electrode layer 405a and the electrode layer 405b can have a single-layer structure or a layered structure.

In the step of adding an impurity element to the pair of low-resistance regions 404a and 404b, the impurity element is also added to regions of the electrode layer 405a and the electrode layer 405b, which are in contact with the gate insulating layer 402; accordingly, the resistance thereof might be reduced. Thus, when the electrode layer 405a and the electrode layer 405b are in contact with the wiring layer 465a and the wiring layer 465b, respectively, in such regions, the contact resistance of the connection regions can be reduced. Thus, on-state characteristics (e.g., on-state current and field-effect mobility), which is one of the electric characteristics of a transistor, operation speed, and response speed of the transistor 420 can be high.

Note that in the case where an oxide semiconductor is employed as a material for forming the electrode layer 405a and the electrode layer 405b, it is necessary, at the time of patterning the oxide semiconductor layer 403, to use a material that can have etching selectivity at least between the oxide semiconductor layer 403 and the electrode layers 405a and 405b which are exposed from the base insulating layer 436 so that the electrode layers 405a and 405b are not etched as much as possible. However, in some cases, as in a transistor 421 illustrated in FIG. 1C, an electrode layer 415a and an electrode layer 415b are partly etched.

In some cases, in the case where an oxide semiconductor is employed as a material for forming the electrode layers, the interfaces between the oxide semiconductor layer and the electrode layers are unclear depending on the material or the film formation conditions of the oxide semiconductor layer. Further, in the case where the interfaces are unclear, a portion which can be called a mixed region or a mixed layer of the electrode layer and the oxide semiconductor layer is formed in some cases. Note that in FIG. 1C, interfaces between the oxide semiconductor layer 403 and the electrode layers 415a and 415b are schematically illustrated by a dotted line.

Figure 1C:
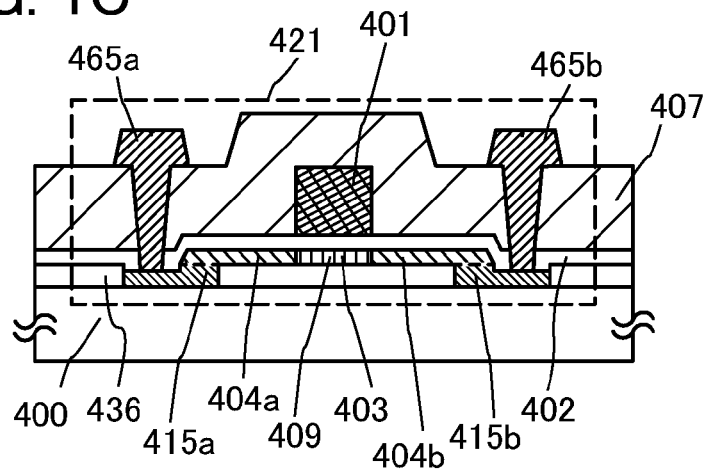
Figure 2A:
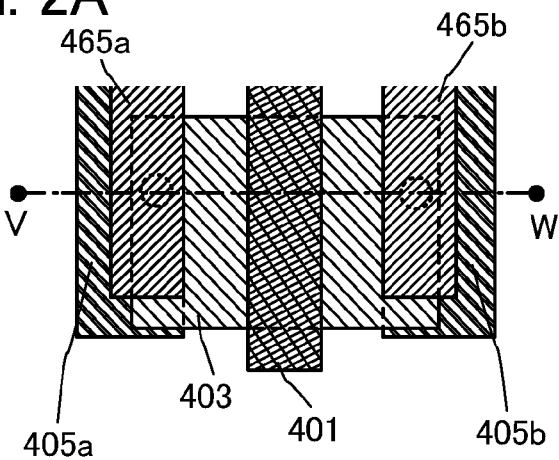
FIGS. 2A to 2C are a plan view and cross-sectional views illustrating one embodiment of a semiconductor device.
Figure 2B:
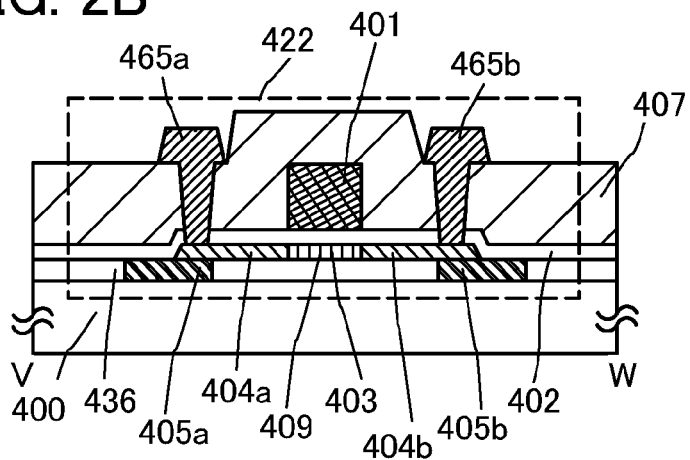
Figure 2C:
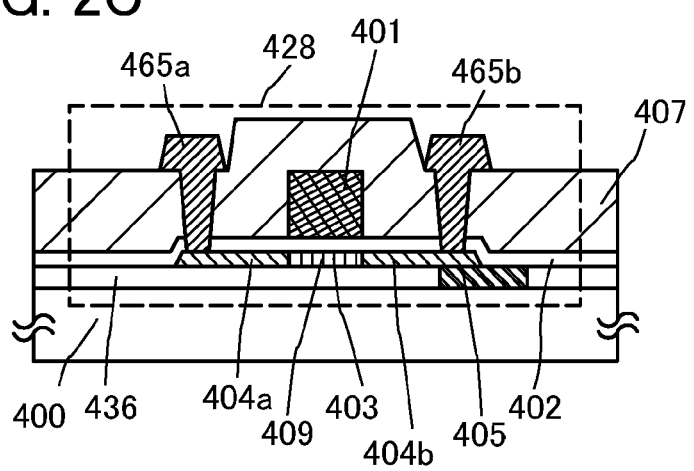

Although, in the transistor 420 and the transistor 421 illustrated in FIGS. 1A to 1C, the electrode layers are each in contact with the wiring layer outside the island-shaped oxide semiconductor layer, one embodiment of the present invention is not limited thereto. FIGS. 2A and 2B are a plan view and a cross-sectional view which illustrate a transistor 422 as another example of a semiconductor device. FIG. 2A is a plan view of the transistor 422, and FIG. 2B is a cross-sectional view taken along the line V-W in FIG. 2A. Note that in FIG. 2A, some components of the transistor 422 (e.g., the insulating layer 407) are not illustrated for simplicity.

In the transistor 422 illustrated in FIGS. 2A and 2B, an opening is formed in a portion of the gate insulating layer 402 and the insulating layer 407, in which the electrode layer 405a or the electrode layer 405b overlaps with the low-resistance region 404a or the low-resistance region 404b of the oxide semiconductor layer 403. Through the opening, the low-resistance region 404a or the low-resistance region 404b of the oxide semiconductor layer 403 is in contact with the wiring layer 465a or the wiring layer 465b, so that the electrode layer 405a or the electrode layer 405b is electrically connected to the wiring layer 465a or 465b in a region thereof overlapping with the island-shaped oxide semiconductor layer 403.

In the transistor 422, the wiring layer 465a and the wiring layer 465b are in contact with the low-resistance region 404a and the low-resistance region 404b of the oxide semiconductor layer 403, respectively, so that the contact resistance between the oxide semiconductor layer 403 and the wiring layers 465a and 465b can be reduced.

Moreover, the electrode layer 405a and the electrode layer 405b are in contact with the low-resistance region 404a and the low-resistance region 404b, respectively, so that the contact resistance between the oxide semiconductor layer 403 and each of the electrode layer 405a and the electrode layer 405b can be reduced.

Although, in the transistor 422, openings are formed in portions of the gate insulating layer 402 and the insulating layer 407, in which both the electrode layer 405a and the electrode layer 405b overlap with the island-shaped oxide semiconductor layer 403, one embodiment of the present invention is not limited thereto. For example, one opening may be formed in a portion of the gate insulating layer 402 and the insulating layer 407, in which the electrode layer 405a overlaps with the island-shaped oxide semiconductor layer 403, and the other opening may be formed in a portion of the gate insulating layer 402 and the insulating layer 407, in which the electrode layer 405b overlaps with the outside of the island-shaped oxide semiconductor layer 403. Alternatively, as in a transistor 428 illustrated in FIG. 2C, an electrode layer 405 may be provided only on either a source side or a drain side. With the structure of the transistor 428, flexibility in layout of a transistor can be improved.

Although, in the transistor 422 illustrated in FIGS. 2A and 2B, the wiring layer 465a and the wiring layer 465b are each in contact with the upper surface of the oxide semiconductor layer 403, one embodiment of the present invention is not limited thereto. For example, as illustrated in FIG. 3A or 3B, the oxide semiconductor layer 403 is partly etched in some cases, which depends on etching conditions to form openings reaching the oxide semiconductor layer 403 (more specifically, the low-resistance region 404a or the low-resistance region 404b).

Figure 3A:
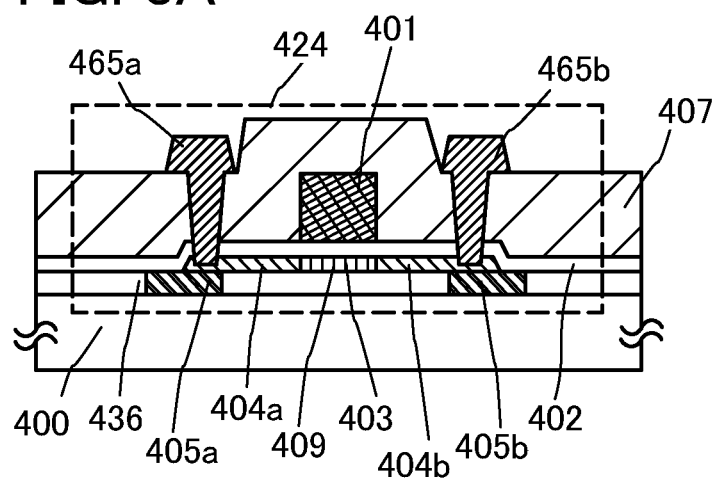
FIGS. 3A and 3B are cross-sectional views each illustrating one embodiment of a semiconductor device.
Figure 3B:
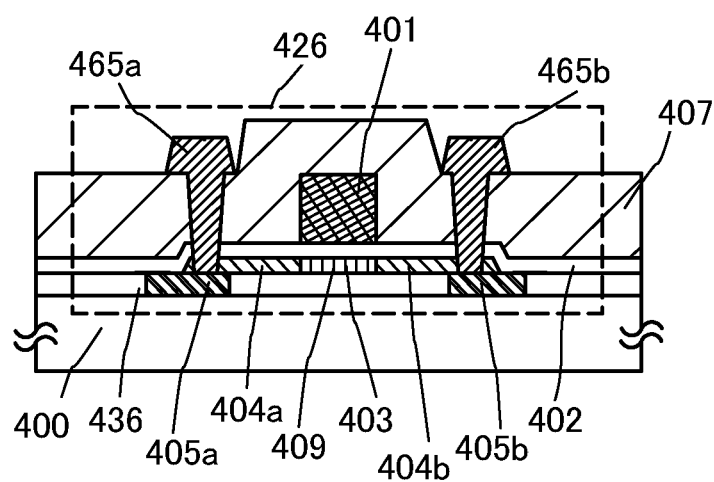

A transistor 424 illustrated in FIG. 3A is an example in which the oxide semiconductor layer 403 is partly etched when openings reaching the oxide semiconductor layer 403 are formed. In the transistor 424, the thickness of the low-resistance region 404a and the low-resistance region 404b which are in contact with the wiring layer 465a and the wiring layer 465b, respectively, is smaller than that of the channel formation region 409. In a similar manner, a transistor 426 illustrated in FIG. 3B is also an example in which the oxide semiconductor layer 403 is partly etched when openings reaching the oxide semiconductor layer 403 are formed. In the transistor 426, the wiring layer 465a and the wiring layer 465b are in contact with the electrode layer 405a and the electrode layer 405b, respectively, through openings which penetrate the oxide semiconductor layer 403.

In each of the transistor 422, the transistor 424, and the transistor 426, the openings are each formed in a region in which the oxide semiconductor layer and the electrode layer provided therebelow are overlapped with each other, and the oxide semiconductor layer and the wiring layers provided thereabove are electrically connected to each other through the openings. Therefore, even in the case where the oxide semiconductor layer is partly etched because the thickness of the oxide semiconductor layer is reduced when each opening is formed or in the case where each opening reaches the electrode layer provided below the oxide semiconductor layer by penetrating the oxide semiconductor layer, the electrode layer provided therebelow enables electrical connection between the wiring layer and the oxide semiconductor layer. As a result, the transistors can be miniaturized with high reliability.

<Method for Manufacturing Semiconductor Device>

Examples of a manufacturing process of the transistor 420 illustrated in FIGS. 1A to 1C will be described below with reference to FIGS. 4A to 4D.

First, a conductive film to be the electrode layer 405a and the electrode layer 405b is formed over the substrate 400 having an insulating surface and is processed into the electrode layer 405a and the electrode layer 405b.

There is no particular limitation on a substrate that can be used as the substrate 400 having an insulating surface as long as it has at least heat resistance to withstand a subsequent heat treatment step. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

Alternatively, a flexible substrate may be used as the substrate 400. In the case of using a flexible substrate, a transistor including an oxide semiconductor may be directly formed on the flexible substrate, or a transistor including an oxide semiconductor may be formed over a different manufacturing substrate and then separated and transferred to the flexible substrate. Note that in order to separate the transistor from the manufacturing substrate and transfer it to the flexible substrate, a separation layer may be provided between the manufacturing substrate and the transistor including the oxide semiconductor.

The electrode layer 405a and the electrode layer 405b are formed using a material that can withstand a subsequent heat treatment with a thickness larger than or equal to 10 nm and smaller than or equal to 500 nm by a plasma-enhanced CVD method, a sputtering method, or the like. For example, a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like can be used. A metal film having a high melting point of titanium, molybdenum, tungsten, or the like or a metal nitride film of any of these elements (a titanium nitride film, a molybdenum nitride film, or a tungsten nitride film) may be stacked on one or both of a lower side and an upper side of the metal film of aluminum, copper, or the like.

Alternatively, the conductive film used for the electrode layer 405a and the electrode layer 405b may be formed using an oxide semiconductor. As the oxide semiconductor, an In—Ga—Zn-based oxide, an indium oxide ($In_2O_3$), a tin oxide ($SnO_2$), a zinc oxide (ZnO), an indium oxide-tin oxide ($In_2O_3$—$SnO_2$, which is abbreviated to ITO), an indium oxide-zinc oxide ($In_2O_3$—ZnO), or any of these oxide semiconductor materials containing silicon oxide can be used.

Figure 4A:
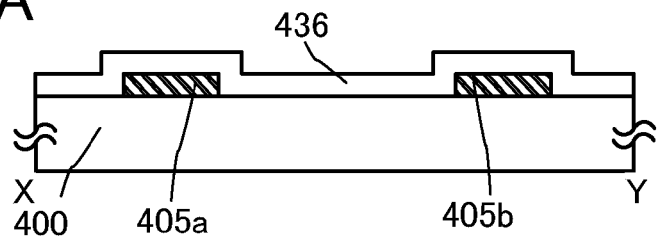
FIGS. 4A to 4D are cross-sectional views illustrating an example of a manufacturing process of a semiconductor device.

Next, the base insulating layer 436 is formed over the electrode layer 405a and the electrode layer 405b (see FIG. 4A). The base insulating layer 436 can have a single-layer or a layered structure including one or more films selected from those containing silicon oxide, silicon nitride, silicon oxynitride, silicon nitride oxide, aluminum oxide, aluminum nitride, aluminum oxynitride, aluminum nitride oxide, hafnium oxide, gallium oxide, and a mixed material of any of these materials. Note that the base insulating layer 436 preferably has a single-layer structure or a layered structure including an oxide insulating film so that the oxide insulating film is in contact with an oxide semiconductor layer to be formed later.

The base insulating layer 436 preferably includes a region where the oxygen content is higher than that in the stoichiometric composition (hereinafter also referred to as oxygen-excess region), in which case oxygen vacancies in the oxide semiconductor layer to be formed later can be filled with the excess oxygen contained in the base insulating layer 436. In the case of having a layered structure, the base insulating layer 436 preferably includes an oxygen-excess region at least in a layer in contact with the oxide semiconductor layer. In order to provide the oxygen-excess region in the base insulating layer 436, for example, the base insulating layer 436 may be formed in an oxygen atmosphere. Alternatively, the oxygen-excess region may be formed by adding oxygen (including at least one of an oxygen radical, an oxygen atom, and an oxygen ion) to the base insulating layer 436 after its formation. Oxygen can be added by an ion implantation method, an ion doping method, a plasma immersion ion implantation method, a plasma treatment, or the like.

Note that the electrode layer 405a and the electrode layer 405b may be subjected to a nitrogen plasma treatment before the base insulating layer 436 is formed. By performing a nitrogen plasma treatment, contact resistance between the oxide semiconductor layer 403 to be formed later and the electrode layers 405a and 405b can be reduced.

Next, the upper surfaces of the electrode layer 405a and the electrode layer 405b are exposed by performing a polishing treatment (e.g., a chemical mechanical polishing (CMP) treatment) or an etching treatment on the base insulating layer 436. The polishing treatment or etching treatment may be performed plural times or these treatments may be performed in combination. In the case where above treatments are performed in combination, the order of steps is not particularly limited. However, it is preferable to planarize the surface of the base insulating layer 436 as much as possible in order to improve crystallinity of the oxide semiconductor layer provided over the base insulating layer 436.

Next, the oxide semiconductor layer 403 is formed so as to be in contact with the upper surfaces of the exposed electrode layers 405a and 405b and part of the base insulating layer 436.

The oxide semiconductor layer 403 may have either a single-layer structure or a layered structure. Further, the oxide semiconductor layer 403 may either have an amorphous structure or be a crystalline oxide semiconductor. In the case where the oxide semiconductor layer 403 has an amorphous structure, a heat treatment may be performed on the oxide semiconductor layer in a subsequent manufacturing step so that the oxide semiconductor layer has crystallinity. The heat treatment for crystallizing the amorphous oxide semiconductor layer is performed at a temperature higher than or equal to 250° C. and lower than or equal to 700° C., preferably higher than or equal to 400° C., more preferably higher than or equal to 500° C., much more preferably higher than or equal to 550° C. Note that the heat treatment can also serve as another heat treatment in the manufacturing process.

The oxide semiconductor layer 403 can be formed by a sputtering method, a molecular beam epitaxy (MBE) method, a CVD method, a pulse laser deposition method, an atomic layer deposition (ALD) method, or the like as appropriate. The oxide semiconductor layer 403 may be formed with a sputtering apparatus which performs deposition in the state where top surfaces of a plurality of substrates are substantially perpendicular to a top surface of a sputtering target.

In the formation of the oxide semiconductor layer 403, the concentration of hydrogen contained in the oxide semiconductor layer 403 is preferably reduced as much as possible. In order to reduce the hydrogen concentration, for example, in the case where the oxide semiconductor layer 403 is formed by a sputtering method, a rare gas (typically, argon), an oxygen gas, and a mixed gas of a rare gas and an oxygen gas, which are high-purity gases and from which impurities such as hydrogen, water, a hydroxyl group, and hydride are removed, are used as appropriate as an atmosphere gas supplied to a treatment chamber of a sputtering apparatus.

The oxide semiconductor layer is deposited in such a manner that a sputtering gas from which hydrogen and moisture have been removed is introduced into the treatment chamber while moisture remaining therein is removed, whereby the hydrogen concentration in the deposited oxide semiconductor layer can be reduced. In order to remove moisture remaining in the deposition chamber, an entrapment vacuum pump such as a cryopump, an ion pump, or a titanium sublimation pump is preferably used. A turbo molecular pump to which a cold trap is added may be used. In the deposition chamber which is evacuated with a cryopump, for example, a hydrogen atom, a compound containing a hydrogen atom, such as water ($H_2O$), (more preferably, also a compound containing a carbon atom), and the like have high evacuation capability; therefore, the concentration of an impurity contained in the oxide semiconductor layer 403 deposited in the deposition chamber can be reduced.

Further, when the oxide semiconductor layer 403 is formed by a sputtering method, the relative density (fill rate) of a metal oxide target that is used for the deposition is greater than or equal to 90% and less than or equal to 100%, preferably greater than or equal to 95% and less than or equal to 99.9%. With the use of a metal oxide target with a high relative density, a dense oxide semiconductor layer can be deposited.

In order to reduce the impurity concentration in the oxide semiconductor layer 403, it is also effective to form the oxide semiconductor layer 403 while the substrate 400 is kept at high temperature. The heating temperature of the substrate 400 is higher than or equal to 150° C. and lower than or equal to 450° C., and preferably the substrate temperature is higher than or equal to 200° C. and lower than or equal to 350° C. A crystalline oxide semiconductor layer can be formed by heating the substrate at a high temperature in the formation.

An oxide semiconductor to be used for the oxide semiconductor layer 403 preferably contains at least indium (In) or zinc (Zn). In particular, In and Zn are preferably contained. As a stabilizer for reducing variation in electric characteristics of a transistor including the oxide semiconductor, it is preferable that gallium (Ga) be additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

The oxide semiconductor layer 403 is preferably formed under a condition such that much oxygen is contained (for example, by a sputtering method in an atmosphere where the proportion of oxygen is 100%) so as to be a film containing much oxygen (preferably having a region where the oxygen content is in excess of that in the stoichiometric composition of the oxide semiconductor in a crystalline state).

It is preferable that a high-purity gas from which an impurity such as hydrogen, water, a hydroxyl group, or a hydride is removed be used as the sputtering gas used for the deposition of the oxide semiconductor layer 403.

There are three methods for obtaining a CAAC-OS film when the CAAC-OS film is used as the oxide semiconductor layer 403. The first method is to deposit an oxide semiconductor layer at a film formation temperature higher than or equal to 200° C. and lower than or equal to 450° C., thereby obtaining c-axis alignment substantially perpendicular to a surface. The second method is to deposit a thin oxide semiconductor layer and then subject the layer to a heat treatment performed at a temperature higher than or equal to 200° C. and lower than or equal to 700° C., thereby obtaining c-axis alignment substantially perpendicular to a surface. The third method is to deposit a first thin oxide semiconductor layer, subject the layer to a heat treatment performed at a temperature higher than or equal to 200° C. and lower than or equal to 700° C., and then form a second oxide semiconductor layer, thereby obtaining c-axis alignment substantially perpendicular to a surface.

Crystallization of the oxide semiconductor layer 403 can be achieved effectively because, in this embodiment, the surface on which the oxide semiconductor layer 403 is to be formed is planarized by performing a polishing treatment or an etching treatment on the base insulating layer 436 to expose the upper surfaces of the electrode layer 405a and the electrode layer 405b. Note that a planarization treatment may be further performed in addition to the polishing treatment or etching treatment performed on the base insulating layer 436 to expose the upper surfaces of the electrode layers 405a and 405b. Although a planarization treatment is not particularly limited, a polishing treatment, a dry etching treatment, or a plasma treatment can be performed.

As a plasma treatment, reverse sputtering in which an argon gas is introduced and plasma is generated can be performed, for example.

As the planarization treatment, a polishing treatment, a dry etching treatment, or a plasma treatment may be performed plural times, or these treatments may be performed in combination. In the case where the above treatments are performed in combination, the order of steps is not particularly limited and may be set as appropriate.

The island-shaped oxide semiconductor layer 403 is formed by processing an oxide semiconductor film after formation by a photolithography process. A resist mask used for processing the oxide semiconductor film into the island-shaped oxide semiconductor layer 403 may be formed by an ink-jet method. Formation of the resist mask by an ink-jet method needs no photomask; thus, manufacturing cost can be reduced.

Note that at the time of processing the oxide semiconductor layer 403 into an island shape, a resist mask is formed so that the oxide semiconductor layer 403 after the processing is at least partly in contact with the upper surfaces of the exposed electrode layers 405a and 405b. Although, in this embodiment, the end portions of the island-shaped oxide semiconductor layer 403 are in contact with the upper surfaces of the electrode layers 405a and 405b, one embodiment of the present invention is not limited thereto. For example, the oxide semiconductor layer 403 may be processed into an island shape so as to cover the entire surfaces of the exposed electrode layers 405a and 405b.

Further, the oxide semiconductor layer 403 is preferably subjected to a heat treatment for removing excess hydrogen (including water and a hydroxyl group) contained in the oxide semiconductor layer 403 (dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like.

Hydrogen, which is an n-type impurity, can be removed from the oxide semiconductor by the heat treatment. For example, the hydrogen concentration in the oxide semiconductor layer 403 after the dehydration or dehydrogenation treatment can be lower than or equal to $5\times10^{19}/cm^3$, preferably lower than or equal to $5\times10^{18}/cm^3$.

Note that the heat treatment for the dehydration or dehydrogenation may be performed at any timing in the process of manufacturing the transistor 420 as long as it is performed after the formation of the oxide semiconductor layer. In the case where an aluminum oxide film is formed as the gate insulating layer 402 and the insulating layer 407, the heat treatment is preferably performed before the aluminum oxide film is formed. The heat treatment for dehydration or dehydrogenation may be performed plural times, and may also serve as another heat treatment.

Note that the heat treatment for the dehydration or dehydrogenation is preferably performed before the oxide semiconductor layer 403 is processed into an island shape, in which case release of oxygen contained in the base insulating layer 436 by the heat treatment can be prevented.

In the heat treatment, it is preferable that water, hydrogen, and the like be not contained in nitrogen or a rare gas such as helium, neon, or argon that are employed. The purity of nitrogen or the rare gas such as helium, neon, or argon which is introduced into the heat treatment apparatus is set to preferably higher than or equal to 6N (99.9999%), more preferably hither than or equal to 7N (99.99999%) (i.e., the impurity concentration is preferably lower than or equal to 1 ppm, more preferably lower than or equal to 0.1 ppm).

In addition, after the oxide semiconductor layer 403 is heated by the heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace while the heating temperature is being maintained or being gradually decreased. It is preferable that water, hydrogen, or the like be not contained in the oxygen gas or the N$_2$O gas. The purity of the oxygen gas or the N$_2$O gas which is introduced to the heat treatment apparatus is preferably higher than or equal to 6N, more preferably higher than or equal to 7N (i.e., the impurity concentration in the oxygen gas or the N$_2$O gas is preferably lower than or equal to 1 ppm, more preferably lower than or equal to 0.1 ppm). The oxygen gas or the N$_2$O gas acts to supply oxygen that is a main component of the oxide semiconductor and that is reduced by the step for removing an impurity for the dehydration or dehydrogenation, so that the oxide semiconductor layer 403 can be a high-purity and electrically i-type (intrinsic) oxide semiconductor layer.

Further or alternatively, oxygen (which includes at least one of an oxygen radical, an oxygen atom, and an oxygen ion) may be added to the oxide semiconductor layer after being subjected to the dehydration or dehydrogenation treatment to supply oxygen to the oxide semiconductor layer.

Oxygen which is added to the dehydrated or dehydrogenated oxide semiconductor layer 403 to supply oxygen to the film can highly purify the oxide semiconductor layer 403 and make the film an i-type (intrinsic). Variation in electric characteristics of a transistor having the oxide semiconductor layer 403 which is highly-purified and i-type (intrinsic) is suppressed, and the transistor is electrically stable.

In the step of addition of oxygen to the oxide semiconductor layer 403, oxygen may be directly added to the oxide semiconductor layer 403 or may be added to the oxide semiconductor layer 403 through another film such as the gate insulating layer 402 or the insulating layer 407 to be formed later. An ion implantation method, an ion doping method, a plasma immersion ion implantation method, or the like may be employed for the addition of oxygen through another film, whereas a plasma treatment or the like can also be employed in addition to the above methods for the direct addition of oxygen to the exposed oxide semiconductor layer 403.

The addition of oxygen to the oxide semiconductor layer 403 can be performed anytime after the dehydration or dehydrogenation treatment is performed thereon. Further, oxygen may be added a plurality of times to the dehydrated or dehydrogenated oxide semiconductor layer 403.

Figure 4B:
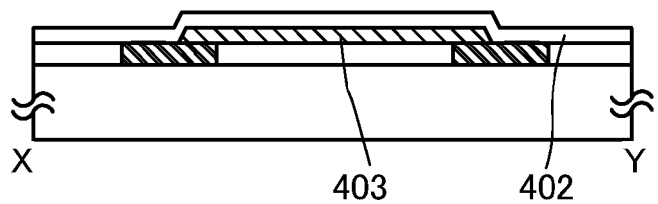

Next, the gate insulating layer 402 covering the oxide semiconductor layer 403 is formed (see FIG. 4B).

The gate insulating layer 402 can be formed to have a thickness larger than or equal to 1 nm and smaller than or equal to 20 nm by a sputtering method, an MBE method, a CVD method, a pulse laser deposition method, an ALD method, or the like as appropriate. The gate insulating layer 402 may be formed with a sputtering apparatus which performs deposition in the state where top surfaces of a plurality of substrates are substantially perpendicular to a top surface of a sputtering target.

The gate insulating layer 402 can be formed using as a material silicon oxide, gallium oxide, aluminum oxide, silicon nitride, silicon oxynitride, aluminum oxynitride, silicon nitride oxide, or the like. It is preferable that the gate insulating layer 402 include oxygen in a portion which is in contact with the oxide semiconductor layer 403. In particular, it is preferable that the oxygen content of the gate insulating layer 402 in (a bulk of) the film be in excess of that in the stoichiometric composition. For example, in the case where a silicon oxide film is used as the gate insulating layer 402, the composition formula thereof is preferably SiO$_{2+\alpha}$ ($\alpha$>0). In this embodiment, a silicon oxide film of SiO$_{2+\alpha}$ ($\alpha$>0) is used as the gate insulating layer 402. By using the silicon oxide film as the gate insulating layer 402, oxygen can be supplied to the oxide semiconductor layer 403, leading to favorable characteristics. Further, the gate insulating layer 402 is preferably formed in consideration of the size of a transistor to be formed and the step coverage with the gate insulating layer 402.

When the gate insulating layer 402 is formed using a high-k material such as hafnium oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)), or lanthanum oxide, gate leakage current can be reduced. Further, the gate insulating layer 402 may have either a single-layer structure or a layered structure.

Next, by a plasma-enhanced CVD method, a sputtering method, or the like, the gate electrode layer 401 is formed over the gate insulating layer 402, in which region the base insulating layer 436 and the oxide semiconductor layer 403 overlap with each other (a region overlapping with a portion between the electrode layer 405a and the electrode layer 405b). The gate electrode layer 401 can be formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, a semiconductor film typified by a polycrystalline silicon film doped with an impurity element such as phosphorus, or a silicide film such as a nickel silicide film may be used as the gate electrode layer 401. Further, the gate electrode layer 401 may have either a single-layer structure or a layered structure.

The gate electrode layer 401 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The gate electrode layer 401 can also have a layered structure of the above conductive material and the above metal material.

As one layer of the gate electrode layer 401 which is in contact with the gate insulating layer 402, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function higher than or equal to 5 eV, preferably higher than or equal to 5.5 eV; thus, when these are used as the gate electrode layer, the threshold voltage of the electric characteristics of the transistor can be positive. Accordingly, a so-called normally-off switching element can be provided.

Figure 4C:
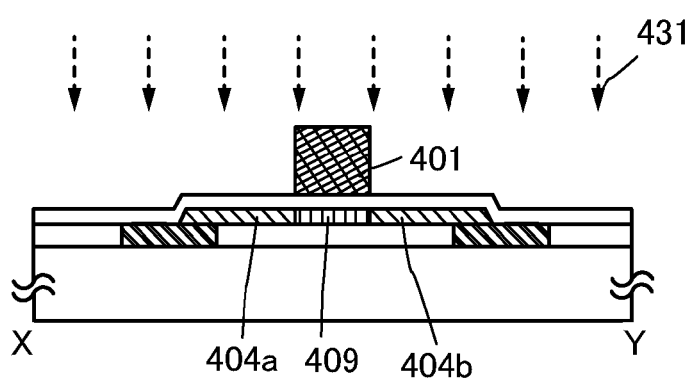
Figure 4D:
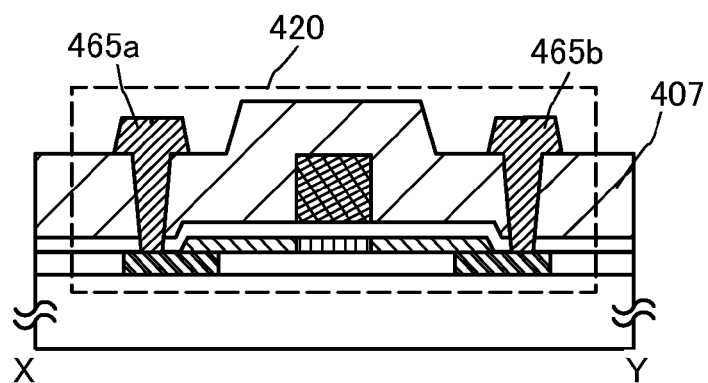

Next, the pair of low-resistance regions 404a and 404b and the channel formation region 409 are formed in a self-aligned manner by adding a dopant 431 to the oxide semiconductor layer 403, using the gate electrode layer 401 as a mask (see FIG. 4C).

The impurity element is also added to regions of the electrode layers 405a and 405b, which are in contact with the gate insulating layer 402, by adding the dopant 431 to the oxide semiconductor layer 403, so that the resistance of the regions of the electrode layers 405a and 405b is similarly reduced. Further, in some cases, the dopant 431 is also added to regions of the electrode layers 405a and 405b, which are in contact with the oxide semiconductor layer 403, depending on the thickness of the gate insulating layer 402 or the oxide semiconductor layer 403 or conditions for adding the dopant 431.

The dopant 431 is an impurity by which the electrical conductivity of the oxide semiconductor layer 403 is changed. One or more selected from the following can be used as the dopant 431: Group 15 elements (typical examples thereof are phosphorus (P), arsenic (As), and antimony (Sb)), boron (B), aluminum (Al), nitrogen (N), argon (Ar), helium (He), neon (Ne), indium (In), fluorine (F), chlorine (Cl), titanium (Ti), and zinc (Zn).

The dopant 431 can be added by an ion implantation method, an ion doping method, a plasma immersion ion implantation method, or the like. In the case where the above method is used, it is preferable to use a single ion, a fluoride ion, or a chloride ion of the dopant 431. Note that the dopant 431 can also be added to the oxide semiconductor layer 403 through the insulating layer 407.

The addition of the dopant 431 may be controlled by setting the addition conditions such as the acceleration voltage and the dosage, or the thickness of the films through which the dopant passes as appropriate. In this embodiment, boron is used as the dopant 431, whose ion is implanted by an ion implantation method. The dosage of the dopant 431 is preferably set to be greater than or equal to $1 \times 10^{13}$ ions/cm$^2$ and less than or equal to $5 \times 10^{16}$ ions/cm$^2$.

The concentration of the dopant 431 in the pair of low-resistance regions 404a and 404b is preferably greater than or equal to $5 \times 10^{18}$/cm$^3$ and less than or equal to $1 \times 10^{22}$/cm$^3$.

The dopant 431 may be added while the substrate 400 is heated.

The addition of the dopant 431 to the oxide semiconductor layer 403 may be performed a plurality of times, and a plurality of kinds of dopant may be used.

Further, a heat treatment may be performed thereon after the addition of the dopant 431. The heat treatment is preferably performed at a temperature(s) higher than or equal to 300° C. and lower than or equal to 700° C. (more preferably higher than or equal to 300° C. and lower than or equal to 450° C.) under an oxygen atmosphere for an hour. The heat treatment may be performed under a nitrogen atmosphere, reduced pressure, or the air (ultra-dry air).

In the case where the oxide semiconductor layer 403 is a crystalline oxide semiconductor layer, part of the oxide semiconductor layer 403 may become amorphous by the addition of the dopant 431. In that case, the crystallinity of the oxide semiconductor layer 403 can be recovered by performing a heat treatment thereon after the addition of the dopant 431.

Thus, the oxide semiconductor layer 403 in which the pair of low-resistance regions 404a and 404b is formed with the channel formation region 409 provided therebetween is formed by the addition of the dopant 431.

Next, the insulating layer 407 is formed over the gate insulating layer 402 and the gate electrode layer 401.

The insulating layer 407 can be formed by a plasma-enhanced CVD method, a sputtering method, an evaporation method, or the like. Further, the insulating layer 407 can be formed using an inorganic insulating film such as a silicon oxide film, a silicon oxynitride film, an aluminum oxide film, a hafnium oxide film, a magnesium oxide film, a zirconium oxide film, a lanthanum oxide film, a barium oxide film, an aluminum oxynitride film, an aluminum nitride film, or a gallium oxide film.

The insulating layer 407 can be either a single-layer film or a layered film. The insulating layer 407 can be a stack of a silicon oxide film and an aluminum oxide film, for example. The aluminum oxide film can be preferably used because it has a high shielding effect (blocking effect), which is impermeable to either or both oxygen and impurities such as hydrogen and moisture, and, in and after the manufacturing process, the aluminum oxide film functions as a protective film for preventing entry of an impurity such as hydrogen or moisture, which causes a change in characteristics, into the oxide semiconductor layer 403 and release of oxygen, which is a main constituent material of the oxide semiconductor, from the oxide semiconductor layer 403.

The insulating layer 407 is preferably formed by a method such as a sputtering method, in which an impurity such as water or hydrogen does not enter the insulating layer 407.

In order to remove residual moisture from the deposition chamber of the insulating layer 407 in a manner similar to that of the deposition of the oxide semiconductor layer 403, an entrapment vacuum pump (such as a cryopump) is preferably used. When the insulating layer 407 is deposited in the deposition chamber evacuated using a cryopump, the impurity concentration of the insulating layer 407 can be reduced. As an evacuation unit for removing residual moisture from the deposition chamber of the insulating layer 407, a turbo molecular pump provided with a cold trap may be used.

Next, the openings reaching the electrode layer 405a and the electrode layer 405b are formed. The wiring layer 465a in contact with the electrode layer 405a and the wiring layer 465b in contact with the electrode layer 405b are formed in the openings (see FIG. 4D).

The wiring layer 465a and the wiring layer 465b can be formed using a material and a method which are similar to those of the gate electrode layer 401. For example, as the wiring layer 465a and the wiring layer 465b, a stack of a tantalum nitride film and a copper film or a stack of a tantalum nitride film and a tungsten film can be used.

Through the above-described process, the transistor 420 of this embodiment can be formed.

The transistors described in this embodiment each include an oxide semiconductor layer including a pair of low-resistance regions and a channel formation region, and electrode layers which are in contact with a lower surface of the oxide semiconductor layer in the pair of low-resistance regions and are embedded in a base insulating layer. Further, wiring layers provided above the oxide semiconductor layer are each electrically connected to the electrode layer or a region of the low-resistance region of the oxide semiconductor layer, which overlaps with the electrode layer. Accordingly, ohmic contacts between the oxide semiconductor layer and the wiring layers provided thereabove and/or the electrode layers embedded in the base insulating layer can be obtained, which also enables the operation to be more thermostable than the operation of a Schottky junction. In addition, the contact resistance can be reduced. Thus, the on-state current of the transistor can be increased and the transistor having excellent electric characteristics can be obtained.

Since the electrode layers electrically connected to the oxide semiconductor layer are embedded in the base insulating layer, a coverage defect of the oxide semiconductor layer might not arise even when the thickness of the electrode layers is increased. Thus, the thickness of the oxide semiconductor layer can be reduced while thickening of the electrode layers and the wiring layers can be accomplished. Accordingly, miniaturization and high-speed driving of the transistor can be achieved. Further, since the surface on which the oxide semiconductor layer is to be formed is planarized, crystallinity of the oxide semiconductor layer can be improved.

Further, an opening for electrically connecting the oxide semiconductor layer and the wiring layer provided thereabove is provided in a region overlapping with the electrode layer embedded in the base insulating layer; therefore, even in the case where the oxide semiconductor layer is partly etched at the time of forming the opening or in the case where the opening reaches the electrode layer provided below the oxide semiconductor layer by penetrating the oxide semiconductor layer, the electrode layer provided therebelow enables electrical connection between the wiring layer and the oxide semiconductor layer. As a result, the transistors can be miniaturized with high reliability. Moreover, the alignment accuracy and processing accuracy which are required for the formation of the opening can be improved.

The methods and structures described in this embodiment can be combined as appropriate with any of the methods and structures described in the other embodiments.

Embodiment 2

In this embodiment, an example of a semiconductor device which includes the transistor described in Embodiment 1, which can hold stored data even when not powered, and which does not have a limitation on the number of write cycles, will be described with reference to drawings. Note that a transistor 162 included in the semiconductor device of this embodiment is the transistor described in Embodiment 1. Any of the structures of the transistors described in Embodiment 1 can be employed for the transistor 162.

Figure 5A:
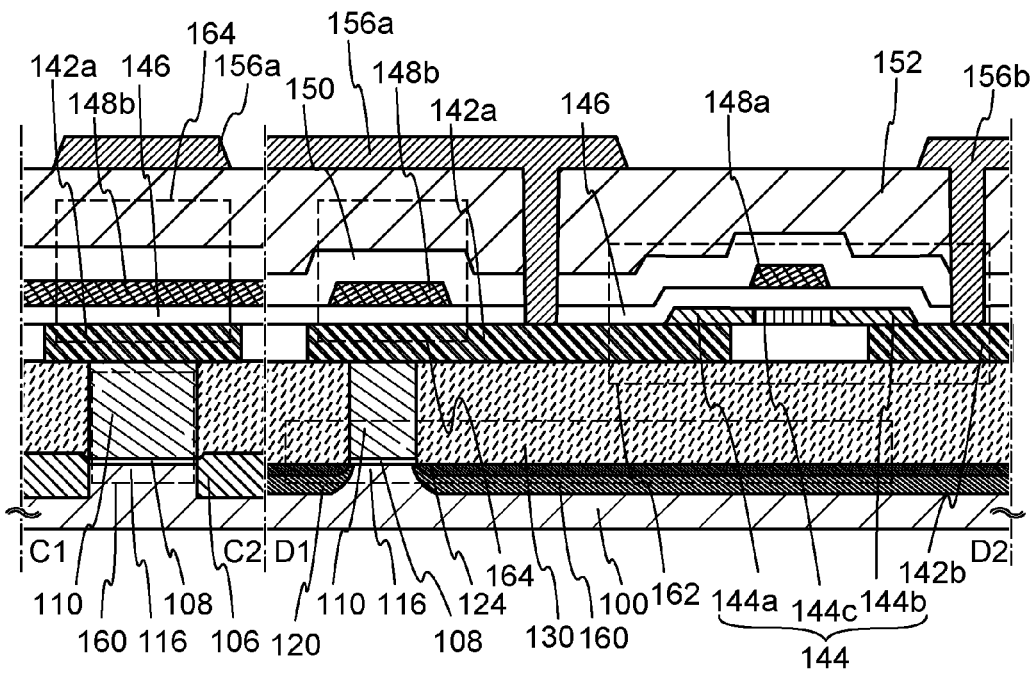
FIGS. 5A to 5C are a cross-sectional view, a plan view, and a circuit diagram illustrating one embodiment of a semiconductor device.
Figure 5B:
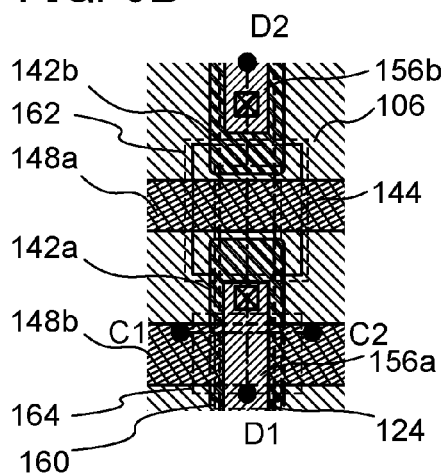
Figure 5C:
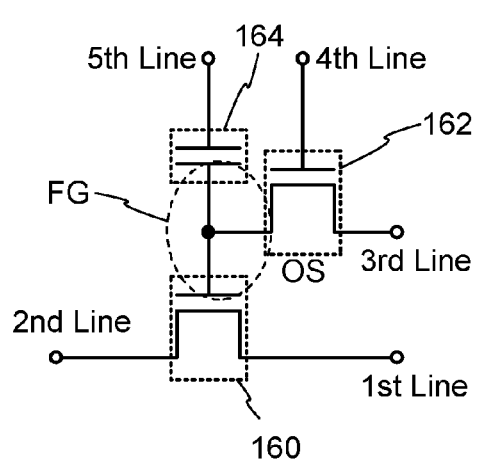

FIGS. 5A to 5C illustrate an example of a structure of a semiconductor device. FIG. 5A is a cross-sectional view of the semiconductor device, FIG. 5B is a plan view of the semiconductor device, and FIG. 5C is a circuit diagram of the semiconductor device. Here, FIG. 5A corresponds to a cross section taken along the line C1-C2 and the line D1-D2 in FIG. 5B.

The semiconductor device illustrated in FIGS. 5A and 5B includes a transistor 160 including a first semiconductor material in a lower portion, and the transistor 162 including a second semiconductor material in an upper portion.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor enables holding of charge for a long time owing to its characteristics.

Since the off-state current of the transistor 162, which is a transistor including an oxide semiconductor, is low, stored data can be held for a long time owing to such a transistor. In other words, power consumption can be sufficiently reduced because a semiconductor storage device in which refresh operation is unnecessary or the frequency of refresh operation is extremely low can be provided.

Although all the transistors are n-channel transistors here, it is needless to say that p-channel transistors can be used. The technical nature of this embodiment of the disclosed invention is to use an oxide semiconductor in the transistor 162 so that data can be held. Therefore, it is not necessary to limit a specific structure of the semiconductor device, such as a material of the semiconductor device or a structure of the semiconductor device, to the structure described here.

The transistor 160 in FIG. 5A includes a channel formation region 116 provided over a substrate 100 including a semiconductor material (e.g., silicon), impurity regions 120 with the channel formation region 116 provided therebetween, intermetallic compound regions 124 in contact with the impurity regions 120, a gate insulating layer 108 provided over the channel formation region 116, and a gate electrode layer 110 provided over the gate insulating layer 108. Note that a transistor whose source electrode and drain electrode are not illustrated in a drawing may also be referred to as a transistor for the sake of convenience. Further, in such a case, in description of a connection of a transistor, a source region and a source electrode are collectively referred to as a "source electrode", and a drain region and a drain electrode are collectively referred to as a "drain electrode". That is, in this specification, the term "source electrode" may include a source region.

An element isolation insulating layer 106 is provided over the substrate 100 to surround the transistor 160. An insulating layer 130 is provided over the element isolation insulating layers 106 and the intermetallic compound regions 124. Note that in order to achieve high integration, it is preferable that, as in FIG. 5A, the transistor 160 do not have a sidewall insulating layer. On the other hand, when the characteristics of the transistor 160 have priority, a sidewall insulating layer may be formed on each side surface of the gate electrode layer 110 and the impurity regions 120 may include a region having a different impurity concentration.

The transistor 162 illustrated in FIG. 5A includes an oxide semiconductor in the channel formation region. Here, an oxide semiconductor layer 144 included in the transistor 162 is preferably highly purified. By using a highly purified oxide semiconductor, the transistor 162 can have extremely favorable off-state current characteristics.

The oxide semiconductor layer 144 includes a pair of low-resistance regions 144a and 144b and a channel formation region 144c.

A conductive layer 148b is provided in a region overlapping with a source electrode layer 142a (or a drain electrode layer 142b) with a gate insulating layer 146 provided therebetween, and a capacitor 164 includes the source electrode layer 142a, the gate insulating layer 146, and the conductive layer 148b. That is, the source electrode layer 142a of the transistor 162 functions as one electrode of the capacitor 164, and the conductive layer 148b functions as the other electrode of the capacitor 164. Note that the capacitor 164 may be omitted if a capacitor is not needed. Alternatively, the capacitor 164 may be separately provided above the transistor 162.

An insulating layer 150 and an insulating layer 152 having a single-layer structure or a layered structure is provided over the transistor 162 and the capacitor 164. Moreover, a wiring layer 156a and a wiring layer 156b which are electrically connected to the source electrode layer 142a and the drain electrode layer 142b of the transistor 162, respectively, are provided over the insulating layer 152. The wiring layer 156a and the wiring layer 156b are electrically connected to the source electrode layer 142a and the drain electrode layer 142b, respectively, through openings formed in the insulating layer 150, the insulating layer 152, the gate insulating layer 146, and the like.

In FIGS. 5A and 5B, the transistor 160 is provided so as to at least partly overlap with the transistor 162. The source region or the drain region of the transistor 160 is preferably provided so as to partly overlap with the oxide semiconductor layer 144. Further, the transistor 162 and the capacitor 164 are provided so as to at least partly overlap with the transistor 160. With such a planar layout, the area occupied by the semiconductor device can be reduced; thus, higher integration can be achieved.

Next, an example of a circuit configuration corresponding to FIGS. 5A and 5B is illustrated in FIG. 5C.

In FIG. 5C, a first wiring (1st Line) is electrically connected to a source electrode of the transistor 160. A second wiring (2nd Line) is electrically connected to a drain electrode of the transistor 160. A third wiring (3rd Line) and one of the source electrode and the drain electrode of the transistor 162 are electrically connected to each other, and a fourth wiring (4th Line) and a gate electrode layer of the transistor 162 are electrically connected to each other. A gate electrode layer of the transistor 160 and one of the source electrode and the drain electrode of the transistor 162 are electrically connected to the other electrode of the capacitor 164. A fifth line (5th Line) and the other electrode of the capacitor 164 are electrically connected to each other.

The semiconductor device illustrated in FIG. 5C utilizes a characteristic in which the potential of the gate electrode layer of the transistor 160 can be held, and thus enables data writing, holding, and reading as follows.

Writing and holding of data are described. First, the potential of the fourth line is set to a potential at which the transistor 162 is turned on, so that the transistor 162 is turned on. Accordingly, the potential of the third wiring is supplied to a node (node FG) to which the gate electrode layer of the transistor 160 and the capacitor 164 are connected. That is, predetermined charge is given to the node FG (writing). Here, one of two kinds of charge providing different potentials (hereinafter referred to as a low-level charge and a high-level charge) is given. After that, the potential of the fourth line is set to a potential at which the transistor 162 is turned off, so that the transistor 162 is turned off. Thus, the charge given to the node FG is held (storing).

Since the off-state current of the transistor 162 is extremely low, the charge of the gate electrode layer of the transistor 160 is held for a long time.

Next, reading of data is described. By supplying an appropriate potential (reading potential) to the fifth line while a predetermined potential (constant potential) is supplied to the first line, the potential of the second line varies depending on the amount of charge held in the node FG. This is because in general, when the transistor 160 is an n-channel transistor, an apparent threshold voltage $V_{th\_H}$ in the case where a high-level charge is given to the node FG (can also be referred to as the gate electrode of the transistor 160) is lower than an apparent threshold voltage $V_{th\_L}$ in the case where a low-level charge is given to the node FG. Here, an apparent threshold voltage refers to the potential of the fifth line, which is needed to turn on the transistor 160. Thus, the potential of the fifth wiring is set to a potential $V_0$ which is between $V_{th\_H}$ and $V_{th\_L}$, whereby charge given to the node FG can be determined. For example, in the case where a high-level charge is given in writing, when the potential of the fifth wiring is set to $V_0$ ($>V_{th\_H}$), the transistor 160 is turned on. In the case where a low level charge is given in writing, even when the potential of the fifth wiring is set to $V_0$ ($<V_{th\_L}$), the transistor 160 remains in an off state. Therefore, the stored data can be read by the potential of the second line.

Note that in the case where memory cells are arrayed to be used, only data of desired memory cells needs to be read. In the case where such reading is not performed, a potential at which the transistor 160 is turned off regardless of the state of the gate electrode layer of the transistor 160, that is, a potential smaller than $V_{th\_H}$ may be given to the fifth wiring. Alternatively, a potential which allows the transistor 160 to be turned on regardless of a state of the gate electrode layer, that is, a potential higher than $V_{th\_L}$ may be applied to the fifth lines.

When a transistor having a channel formation region formed using an oxide semiconductor and having extremely low off-state current is applied to the semiconductor device in this embodiment, the semiconductor device can hold stored data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating layer does not occur at all. In other words, the semiconductor device according to one embodiment of the present invention does not have a limitation on the number of write cycles, which is a problem in a conventional nonvolatile memory, and reliability thereof is drastically improved. Furthermore, data is written or held by turning on or off the transistor, whereby high-speed operation can be easily achieved.

In the transistor 162, the electrode layers embedded in a base insulating layer or the pair of low-resistance regions of the oxide semiconductor layer is electrically connected to the wiring layers provided thereabove; therefore, the contact resistance therebetween can be reduced; thus, a transistor having extremely favorable characteristics (e.g., high on-state current characteristics) can be obtained. Therefore, employment of the transistor 162 enables a high-performance semiconductor device to be provided. Further, since the transistor 162 is highly reliable, high reliability of a semiconductor device can be achieved.

The methods and structures described in this embodiment can be combined as appropriate with any of the methods and structures described in the other embodiments.

Embodiment 3

In this embodiment, a semiconductor device which includes the transistor described in Embodiment 1, which can hold stored data even when not powered, which does not have a limitation on the number of write cycles, and which has a structure different from the structure described in Embodiment 2 will be described with reference to FIGS. 6A and 6B and FIGS. 7A to 7C. Note that a transistor 162 included in the semiconductor device of this embodiment is the transistor described in Embodiment 1. Any of the structures of the transistors described in Embodiment 1 can be employed for the transistor 162.

Figure 6A:
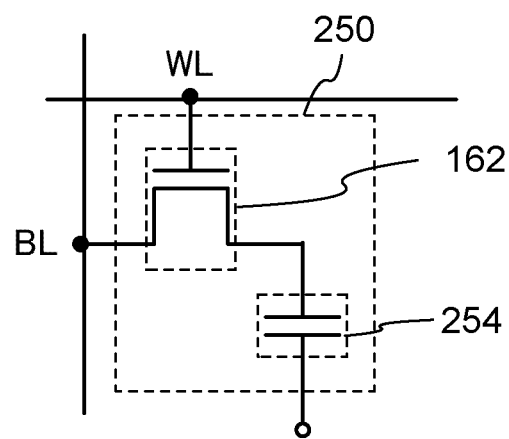
FIGS. 6A and 6B are a circuit diagram and a perspective view illustrating one embodiment of a semiconductor device.
Figure 6B:
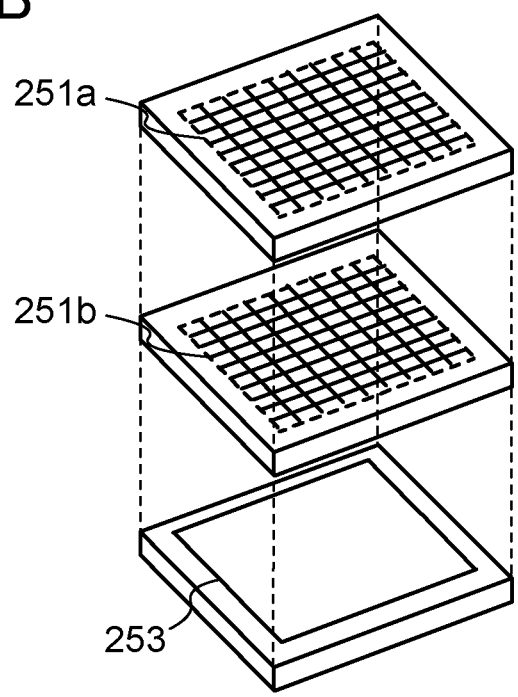

FIG. 6A illustrates an example of a circuit configuration of a semiconductor device, and FIG. 6B is a conceptual diagram illustrating an example of a semiconductor device. First, the semiconductor device illustrated in FIG. 6A is described, and then, the semiconductor device illustrated in FIG. 6B is described.

In the semiconductor device illustrated in FIG. 6A, a bit line BL is electrically connected to one of the source electrode and the drain electrode of the transistor 162, a word line WL is electrically connected to the gate electrode layer of the transistor 162, and the other of the source electrode and the drain electrode of the transistor 162 is electrically connected to a first terminal of a capacitor 254.

The transistor 162 including an oxide semiconductor has extremely low off-state current. For that reason, a potential of the first terminal of the capacitor 254 (or a charge accumulated in the capacitor 254) can be held for an extremely long period by turning off the transistor 162.

Next, writing and holding of data in the semiconductor device (a memory cell 250) illustrated in FIG. 6A are described.

First, the potential of the word line WL is set to a potential at which the transistor 162 is turned on, so that the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Thus, the potential of the first terminal of the capacitor 254 is held (holding).

Since the off-state current of the transistor 162 is extremely low, the potential of the first terminal of the capacitor 254 (or the charge accumulated in the capacitor) can be held for a long time.

Next, reading of data is described. When the transistor 162 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 6A can hold charge that is accumulated in the capacitor 254 for a long time because the off-state current of the transistor 162 is extremely low. In other words, power consumption can be sufficiently reduced because refresh operation becomes unnecessary or the frequency of refresh operation can be extremely low. Moreover, stored data can be held for a long period even when power is not supplied.

Next, the semiconductor device illustrated in FIG. 6B is described.

The semiconductor device illustrated in FIG. 6B includes a memory cell array 251a and a memory cell array 251b including a plurality of memory cells 250 illustrated in FIG. 6A as memory circuits in the upper portion, and a peripheral circuit 253 in the lower portion which is necessary for operating the memory cell array 251a and the memory cell array 251b. Note that the peripheral circuit 253 is electrically connected to the memory cell array 251a and the memory cell array 251b.

In the structure illustrated in FIG. 6B, the peripheral circuit 253 can be provided under the memory cell array 251a and the memory cell array 251b. Thus, the size of the semiconductor device can be decreased.

It is preferable that a semiconductor material of the transistor provided in the peripheral circuit 253 be different from that of the transistor 162. For example, silicon, germanium, silicon germanium, silicon carbide, or gallium arsenide can be used, and a single crystal semiconductor is preferably used. Alternatively, an organic semiconductor material or the like may be used. A transistor including such a semiconductor material can operate at sufficiently high speed. Further, a transistor including a material other than an oxide semiconductor can favorably achieve a variety of circuits (such as a logic circuit or a driver circuit) which are required to operate at high speed.

Note that FIG. 6B illustrates, as an example, the semiconductor device in which two memory cell arrays of the memory cell array 251a and the memory cell array 251b are stacked; however, the number of stacked memory cell arrays is not limited thereto. Three or more memory cell arrays may be stacked.

Next, a specific structure of the memory cell 250 illustrated in FIG. 6A is described with reference to FIGS. 7A to 7C.

Figure 7A:
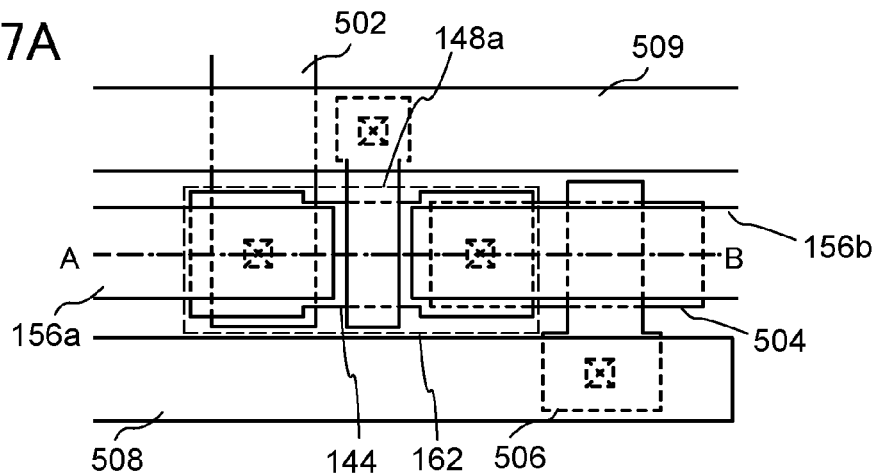
FIG. 7A is a plan view and FIGS. 7B and 7C are cross-sectional views illustrating one embodiment of a semiconductor device.
Figure 7B:
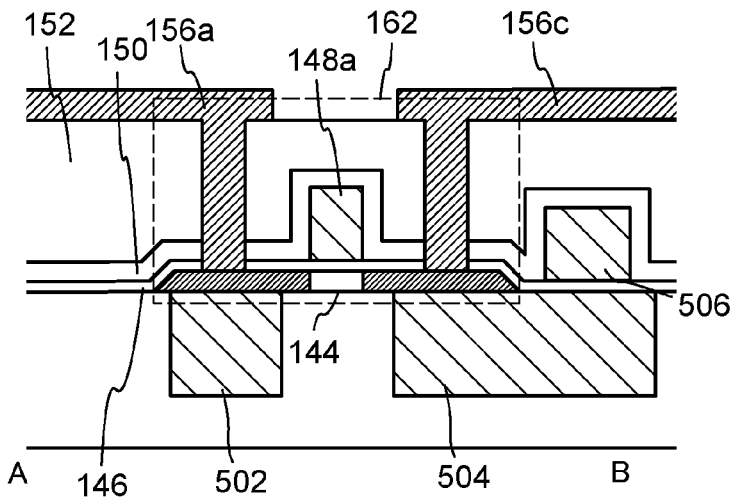
Figure 7C:
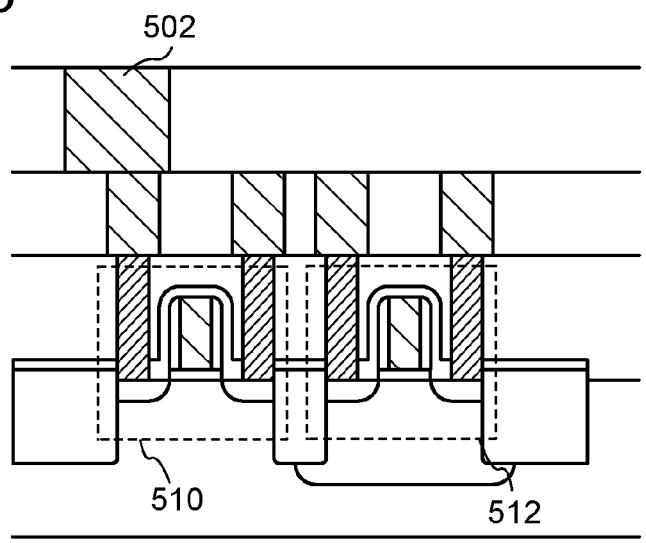

FIGS. 7A to 7C illustrate a structure example of the memory cell 250. FIG. 7A is a plan view of the memory cell 250. FIG. 7B is a cross-sectional view taken along the line A-B in FIG. 7A.

The transistor 162 illustrated in FIGS. 7A and 7B can have a structure similar to any of the structures of the transistors described in Embodiment 1. In this embodiment, an example of a transistor having a structure similar to that of the transistor 420 of Embodiment 1 is described.

As illustrated in FIG. 7B, the transistor 162 is formed over an electrode 502 and an electrode 504. The electrode 502 serves as a bit line BL in FIG. 7A and is in contact with one low-resistance region of an oxide semiconductor layer included in the transistor 162. The electrode 504 serves as one electrode of the capacitor 254 in FIG. 7A and is in contact with the other low-resistance region of the oxide semiconductor layer included in the transistor 162. Over the transistor 162, an electrode 506 provided in a region overlapping with the electrode 504 serves as the other electrode of the capacitor 254.

As illustrated in FIG. 7A, the other electrode 506 of the capacitor 254 is electrically connected to a capacitor line 508. A gate electrode layer 148a over the oxide semiconductor layer 144 with the gate insulating layer 146 provided therebetween is electrically connected to a word line 509.

FIG. 7C is a cross-sectional view in a connection portion between the memory cell array and the peripheral circuit. The peripheral circuit can include, for example, an n-channel transistor 510 and a p-channel transistor 512. The n-channel transistor 510 and the p-channel transistor 512 are preferably formed using a semiconductor material other than an oxide semiconductor (e.g., silicon). With such a material, the transistor included in the peripheral circuit can operate at high speed.

When the planar layout illustrated in FIG. 7A is employed, the area occupied by the semiconductor device can be reduced; thus, the degree of integration can be increased.

As described above, the plurality of memory cells formed in multiple layers in the upper portion each include a transistor including an oxide semiconductor. Since the off-state current of the transistor including a highly purified and intrinsic oxide semiconductor is low, stored data can be held for a long time owing to such a transistor. In other words, power consumption can be sufficiently reduced because the frequency of refresh operation can be extremely low. Further, as illustrated in FIG. 7B, the capacitor 254 is formed by stacking the electrode 504, the oxide semiconductor layer 144, the gate insulating layer 146, and the electrode 506.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently low). In addition, with a structure where the peripheral circuit and the memory circuit are stacked, the degree of integration of the semiconductor device can be increased.

This embodiment can be implemented in combination with any of the other structures described in the other embodiments as appropriate.

Embodiment 4

In this embodiment, examples of application of the semiconductor device described in any of the above embodiments to portable devices such as cellular phones, smartphones, or e-book readers will be described with reference to FIGS. 8A and 8B, FIG. 9, FIG. 10, and FIG. 11.

In portable devices such as a mobile phone, a smartphone, and an e-book reader, an SRAM or a DRAM is used so as to store image data temporarily. This is because response speed of a flash memory is low and thus a flash memory is not suitable for image processing. On the other hand, an SRAM or a DRAM has the following characteristics when used for temporary storage of image data.

Figure 8A:
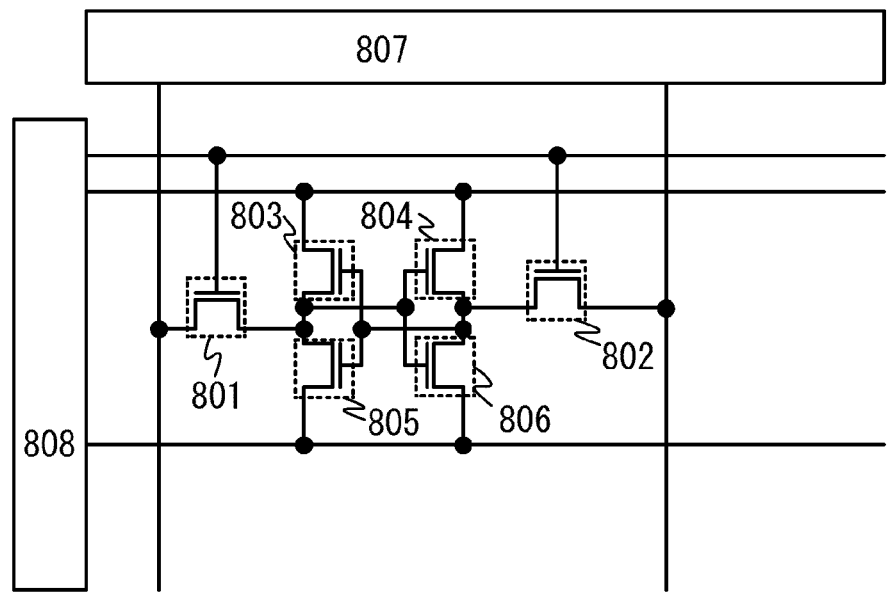
FIGS. 8A and 8B are circuit diagrams each illustrating one embodiment of a semiconductor device.

As illustrated in FIG. 8A, in an ordinary SRAM, one memory cell includes six transistors, that is, transistors 801 to 806, which are driven with an X decoder 807 and a Y decoder 808. A pair of the transistors 803 and 805 and a pair of the transistors 804 and 806 each serve as an inverter, and high-speed driving can be performed therewith. However, since one memory cell includes six transistors, there is a disadvantage that the cell area is large. Provided that the minimum feature size of a design rule is F, the area of a memory cell in an SRAM is generally 100 $F^2$ to 150 $F^2$. Therefore, a price per bit of an SRAM is the highest among a variety of memory devices.

Figure 8B:
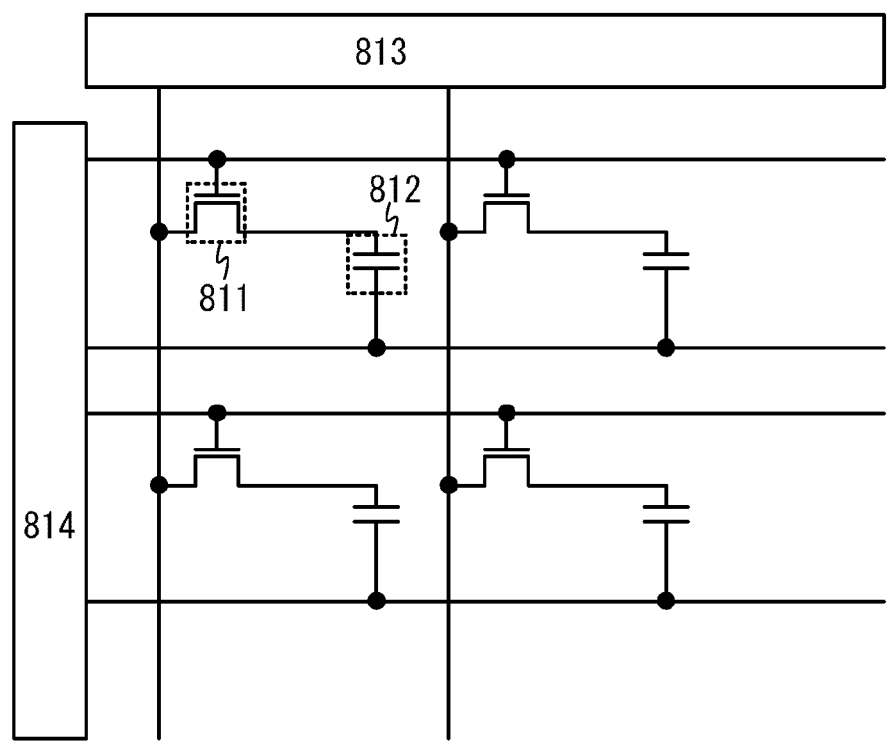

As illustrated in FIG. 8B, in a DRAM, a memory cell includes a transistor 811 and a storage capacitor 812, which are driven with an X decoder 813 and a Y decoder 814. One cell includes one transistor and one capacitor and thus the area of a memory cell is small. The area of a memory cell of a DRAM is generally less than or equal to 10 $F^2$. Note that in the case of a DRAM, a refresh operation is always necessary and power is consumed even when a rewriting operation is not performed.

However, the area of the memory cell of the semiconductor device described in the above embodiments is about 10 $F^2$ and frequent refreshing is not needed. Therefore, the area of the memory cell is reduced, and the power consumption can be reduced.

Figure 9:
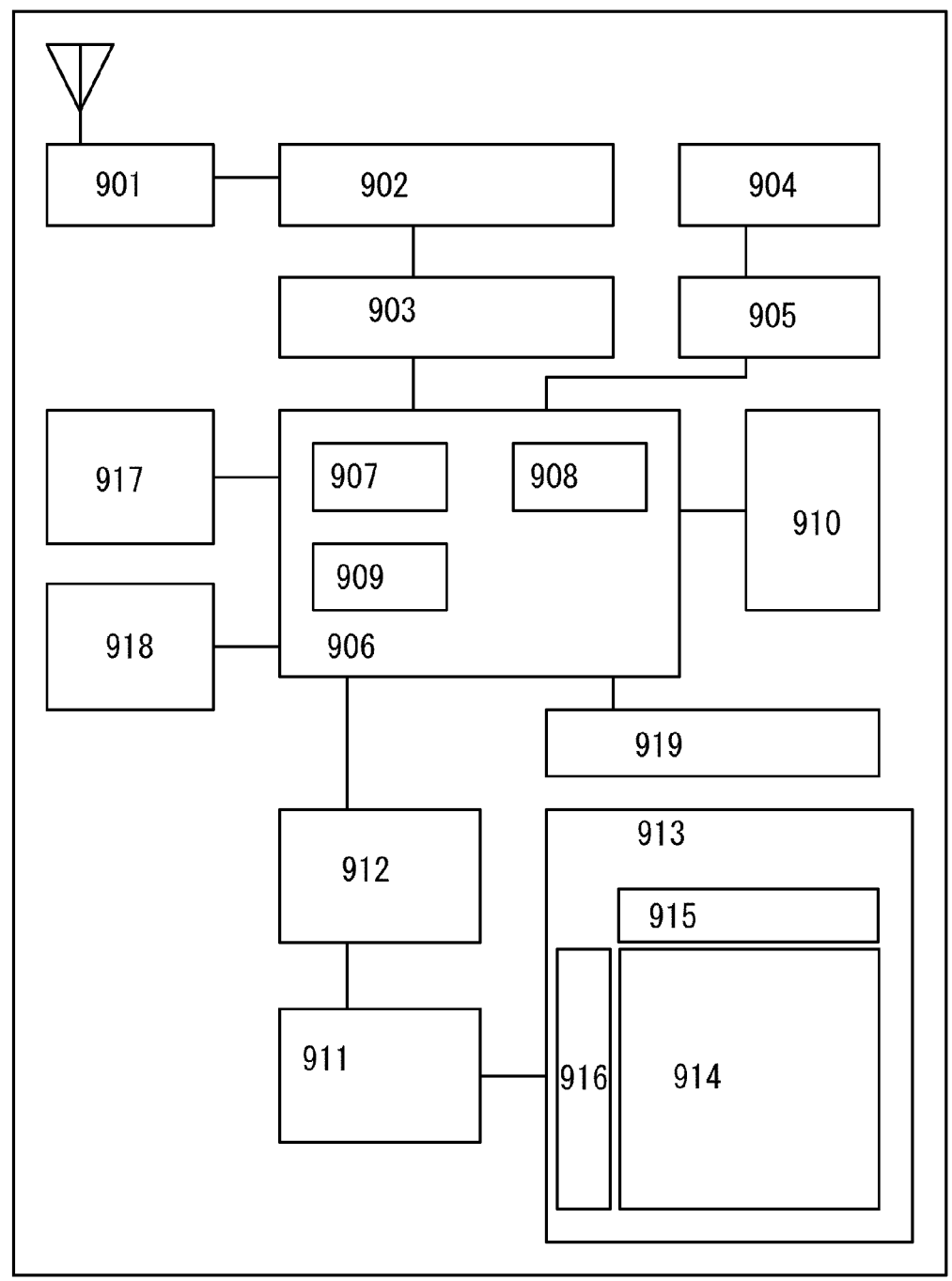
FIG. 9 is a block diagram illustrating one embodiment of a semiconductor device.

Next, FIG. 9 is a block diagram of a portable device. The portable device illustrated in FIG. 9 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM; by employing the semiconductor device described in any of the above embodiments for the memory circuit 912, writing and reading of data can be performed at high speed, stored data can be held for a long time, and power consumption can be sufficiently reduced.

Figure 10:
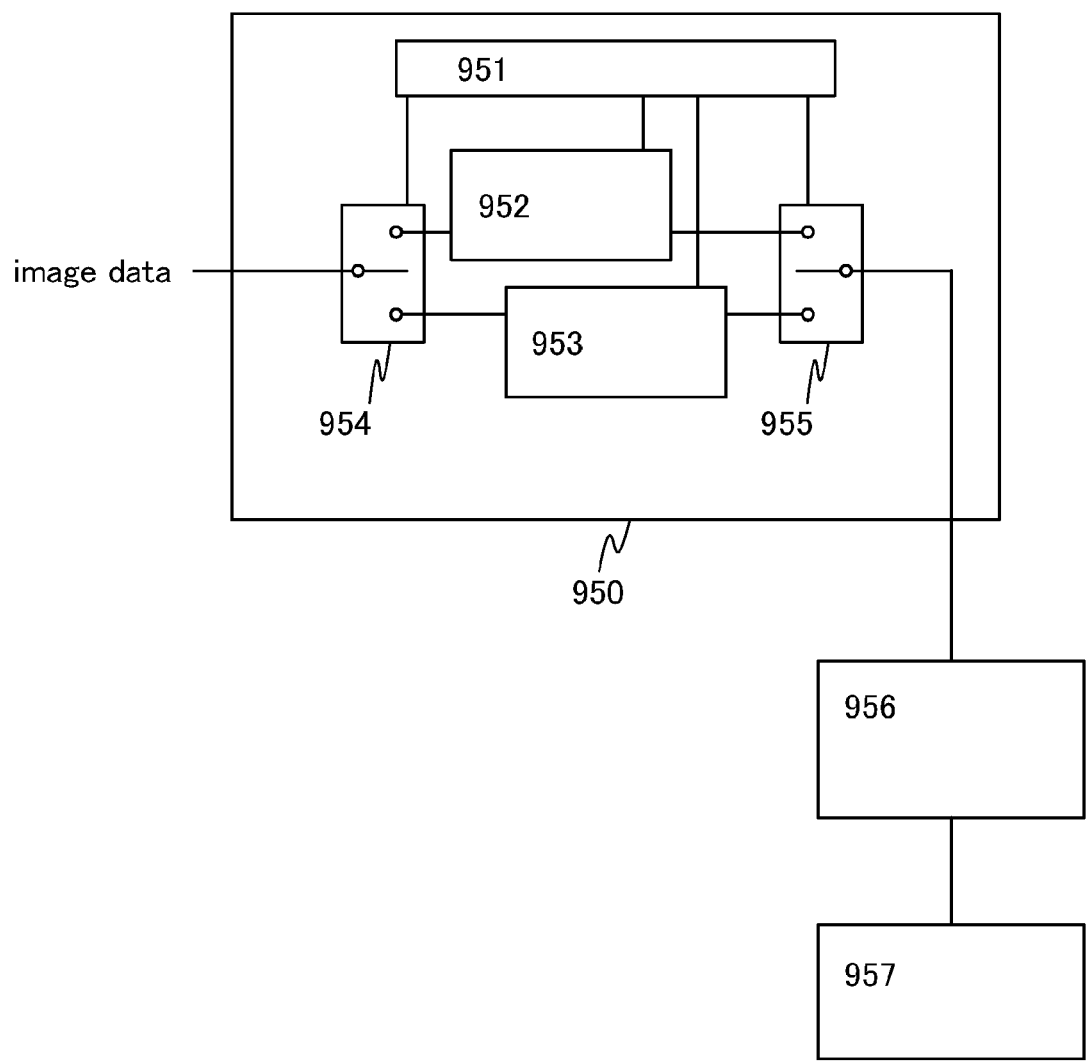
FIG. 10 is a block diagram illustrating one embodiment of a semiconductor device.

FIG. 10 illustrates an example of using the semiconductor device described in any of the above embodiments in a memory circuit 950 for a display. The memory circuit 950 illustrated in FIG. 10 includes a memory 952, a memory 953, a switch 954, a switch 955, and a memory controller 951. Further, the memory circuit is connected to a display controller 956 which reads and controls image data input through a signal line (input image data) and data stored in the memory 952 and the memory 953 (stored image data), and is also connected to a display 957 which displays an image based on a signal from the display controller 956.

First, image data (input image data A) is formed by an application processor (not illustrated). The input image data A is stored in the memory 952 through the switch 954. The image data (stored image data A) stored in the memory 952 is transmitted to the display 957 through the switch 955 and the display controller 956 and is displayed on the display 957.

In the case where the input image data A is not changed, the stored image data A is read from the memory 952 through the switch 955 by the display controller 956 normally at a frequency of 30 Hz to 60 Hz.

Next, for example, when data displayed on the screen is rewritten by a user (i.e., in the case where the input image data A is changed), new image data (input image data B) is formed by the application processor. The input image data B is stored in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is stored in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and stored data can be held for a long time, and power consumption can be sufficiently reduced.

Figure 11:
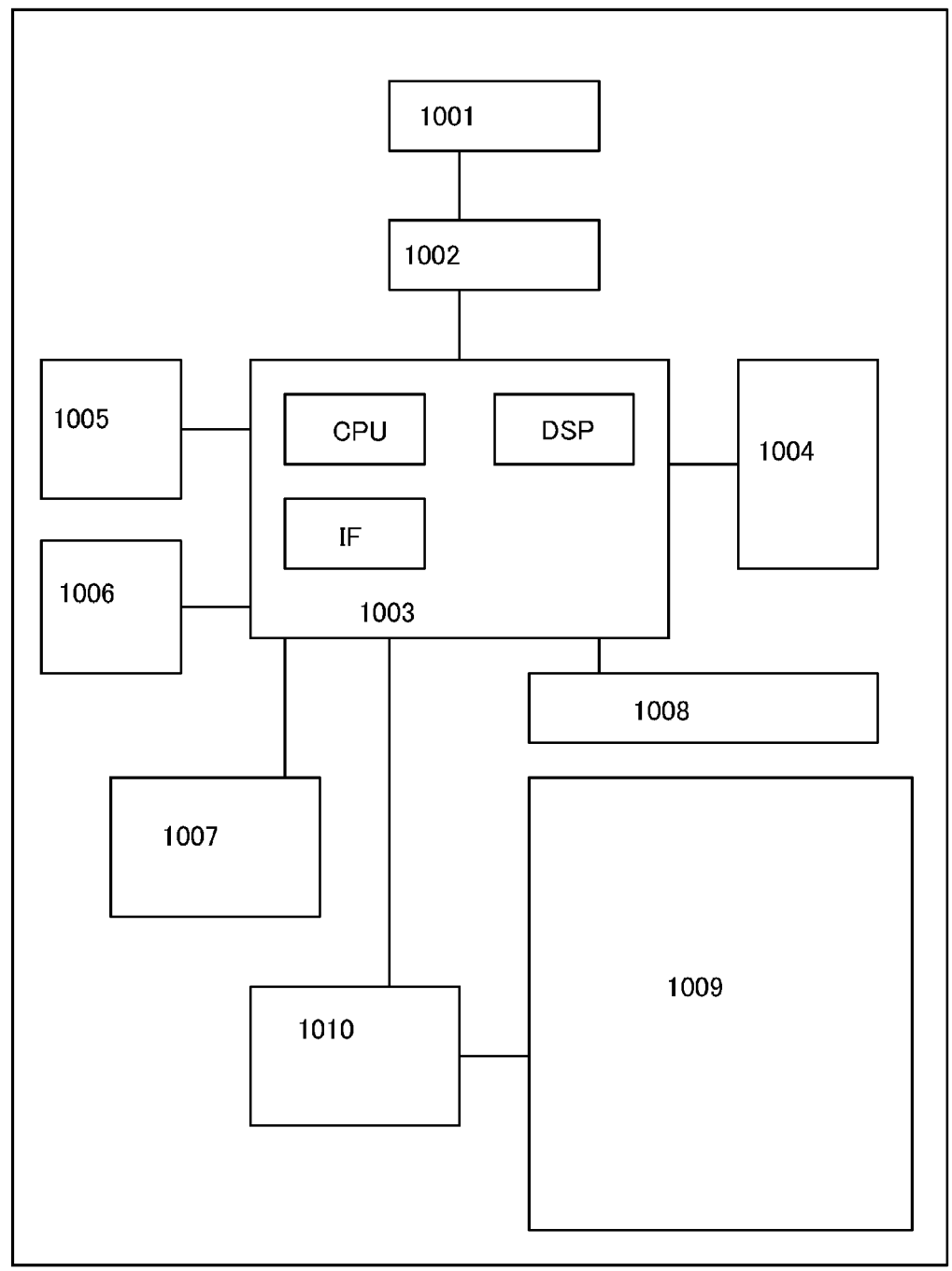
FIG. 11 is a block diagram illustrating one embodiment of a semiconductor device.

FIG. 11 is a block diagram of an e-book reader. The e-book reader in FIG. 11 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 11. The memory circuit 1007 has a function of temporarily holding the contents of a book. For example, when a user reads an e-book reader and wants to put a mark (e.g., change the display color, underline, make characters bold, or change the font of characters) on a specific part, the e-book reader can temporarily store and hold data of the part specified by the user. In the case where the data is stored for a long time, the data may be copied to the flash memory 1004. Even in such a case, by employing the semiconductor device described in any of the above embodiments, writing and reading of data can be performed at high speed, stored data can be held for a long time, and power consumption can be sufficiently reduced.

As described above, the semiconductor device in any of the above embodiments is mounted on each of the portable devices described in this embodiment. Therefore, it is possible to obtain a portable device which is capable of reading data at high speed, holding stored data for a long time, and reducing power consumption.

The structures, methods, and the like described in this embodiment can be combined as appropriate with any of the other structures, methods, and the like described in the other embodiments.

Example

In this example, the transistor described in Embodiment 1 was formed, and the electric characteristics were evaluated.

FIGS. 12A to 12D illustrate the structures of transistors used in this example.

Figure 12A:
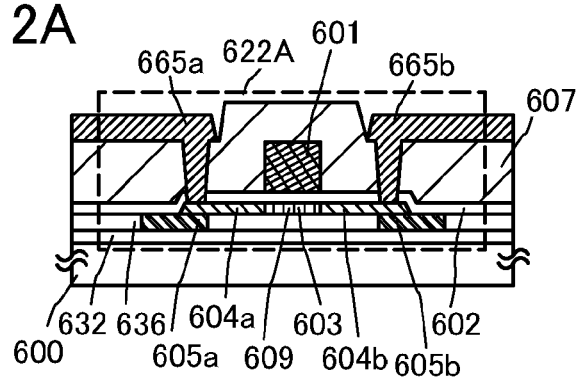
FIGS. 12A to 12D are cross-sectional views illustrating structures of transistors used in Example.
Figure 12B:
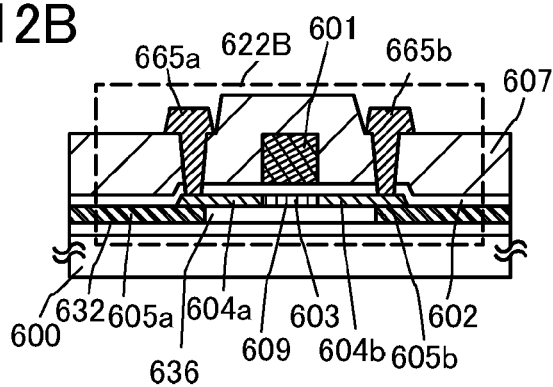

A transistor 622A illustrated in FIG. 12A and a transistor 622B illustrated in FIG. 12B each have a structure similar to that of the transistor 422 of Embodiment 1. In the transistor 622A, a wiring layer 665a is used as a source terminal, and a wiring layer 665b is used as a drain terminal. In the transistor 622B, an electrode layer 605a is used as a source terminal, and an electrode layer 605b is used as a drain terminal.

Figure 12C:
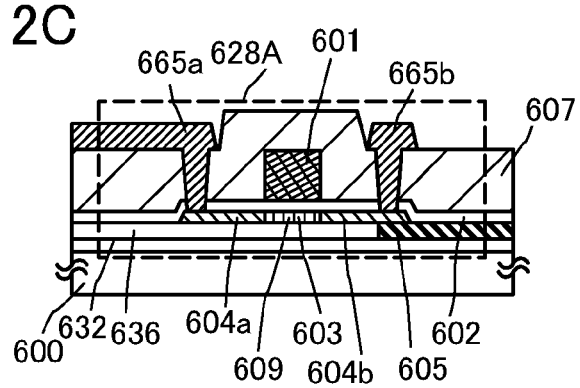
Figure 12D:
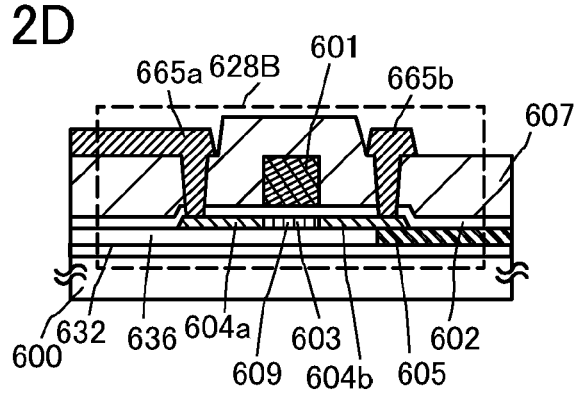

A transistor 628A illustrated in FIG. 12C and a transistor 628B illustrated in FIG. 12D each have a structure similar to that of the transistor 428 of Embodiment 1. In the transistor 628A, an electrode layer 605 is used as a source terminal, and a wiring layer 665a is used as a drain terminal. In the transistor 628B, a wiring layer 665a is used as a source terminal, and an electrode layer 605 is used as a drain terminal.

A method for forming the transistors used in this example will be described below. Note that the transistor 622A, transistor 622B, transistor 628A, and transistor 628B of this example were each formed by a similar method.

First, a silicon substrate 600 was carried into a sputtering apparatus, and reverse sputtering was performed for 3 minutes under an argon atmosphere (the argon gas flow of 50 sccm) with the pressure of 0.4 Pa and the electric power (power output) of 5.0 kW to planarize a surface of the silicon substrate 600. After that, as an insulating layer 632, a silicon oxide film having a thickness of 300 nm was successively formed by a sputtering method without exposure to the air. Deposition conditions of the silicon oxide film were set as follows: oxygen atmosphere (the flow of 50 sccm); pressure, 0.4 Pa; electric power (power output), 5.0 kW; distance between the silicon substrate 600 and a target, 60 mm; and substrate temperature, 100° C.

Next, a tungsten film having a thickness of 100 nm was formed as a conductive film by a sputtering method over the insulating layer 632, and was processed into an electrode layer 605 (the electrode layer 605a and an electrode layer 605b) by a photolithography method. Deposition conditions of the tungsten film were set as follows: tungsten target; argon atmosphere (the argon gas flow of 80 sccm); pressure, 0.8 Pa; electric power (power output), 1.0 kW; and heated argon gas which was introduced to heat the substrate, 10 sccm.

As a base insulating layer 636, a silicon oxide film was formed by a sputtering method over the electrode layer 605 and was subjected to a CMP treatment so that an upper surface of the electrode layer 605 was exposed. Deposition conditions of the silicon oxide film were set as follows: oxygen atmosphere (the flow of 50 sccm); pressure, 0.4 Pa; electric power (power output), 5.0 kW; distance between the silicon substrate 600 and a target, 60 mm; substrate temperature, 100° C.; and thickness, 400 nm. The conditions of the CMP treatment were set as follows: polishing pad for CMP, polyurethane-based polishing cloth; slurry, NP8020 (produced by Nitta Haas Incorporated) in undiluted form (a grain size of silica of 60 nm to 80 nm); slurry temperature, room temperature; polishing pressure, 0.08 MPa; number of spindle rotations on a side where the substrate was fixed, 50 rpm; and number of rotations of a table where the polishing cloth was fixed, 50 rpm.

Next, as an oxide semiconductor layer 603, an In—Ga—Zn—O film having a thickness of 15 nm was formed by a sputtering method over the exposed electrode layer and part of the base insulating layer 636 with the use of an oxide target having a composition ratio of In:Ga:Zn=3:1:2 [atomic ratio]. Deposition conditions were set as follows: mixed atmosphere containing argon and oxygen (Ar: $O_2$=30 sccm: 15 sccm); pressure, 0.4 Pa; electric power, 0.5 kW; and substrate temperature, 200° C.

The formed oxide semiconductor layer 603 was processed into an island shape by an inductively coupled plasma (ICP) etching. Etching conditions were set as follows: etching gas, a mixed gas of boron trichloride and chlorine ($BCl_3$: $Cl_2$=60 sccm: 20 sccm); electric power, 450 W; bias power, 100 W; and pressure, 1.9 Pa.

Next, as a gate insulating layer 602, a silicon nitride oxide film having a thickness of 20 nm was formed by a CVD method over the island-shaped oxide semiconductor layer 603.

A gate electrode layer 601 was formed by stacking a tantalum nitride film having a thickness of 30 nm and a tungsten film having a thickness of 135 nm by a sputtering method over the gate insulating layer 602 and processing the stack by an etching method. Deposition conditions of the tantalum nitride film were set as follows: mixed atmosphere containing argon and nitrogen (Ar:$N_2$=50 sccm: 10 sccm); pressure, 0.6 Pa; and electric power, 1 kW. Deposition conditions of the tungsten film were set as follows: argon atmosphere (the flow of 100 sccm); pressure, 2.0 Pa; electric power, 4 kW; and heated argon gas which was introduced to heat the substrate, 10 sccm.

The tantalum nitride film and the tungsten film were subjected to first to third etching. The first etching was performed under the following conditions: etching gas, a mixed gas of chlorine, carbon tetrafluoride, and oxygen ($Cl_2$:$CF_4$:$O_2$=45 sccm:55 sccm:55 sccm); electric power, 3 kW; bias power, 110 W; pressure, 0.67 Pa; and substrate temperature, 40° C. Accordingly, the tungsten film was etched. After that, the second etching was performed for 15 seconds under the following conditions: etching gas, a chlorine gas ($Cl_2$=100 sccm); electric power, 2 kW; bias power, 50 W; and substrate temperature, −10° C. Then, the third etching was performed for 50 seconds under the following conditions: etching gas, a chlorine gas ($Cl_2$=100 sccm); electric power, 1 kW; bias power, 25 W; and substrate temperature, −10° C. Accordingly, the tantalum nitride film was etched.

Next, phosphorus (P) ion implantation was performed on the oxide semiconductor layer 603 by an ion implantation method with the use of the gate electrode layer 601 as a mask, so that a pair of low-resistance regions 604a and 604b and a channel formation region 609 were formed in a self-aligned manner. Note that the conditions of the phosphorus (P) ion implantation were set as follows: acceleration voltage, 30 kV; and dosage, $1.0 \times 10^{15}$ ions/$cm^2$.

Next, as an insulating layer 607, a silicon nitride oxide film having a thickness of 300 nm was formed by a CVD method.

Openings reaching the oxide semiconductor layer 603 were formed in the insulating layer 607 and the gate insulating layer 602, and a molybdenum film having a thickness of 300 nm was formed in the openings by a sputtering method and processed by etching to form the wiring layer 665a and the wiring layer 665b. Deposition conditions of the molybdenum film were set as follows: argon atmosphere (Ar=50 sccm); pressure, 0.3 Pa; and electric power, 2 kW. The etching conditions of the molybdenum film was set as follows: etching gas, a mixed gas of chlorine, carbon tetrafluoride, and oxygen ($Cl_2$:$CF_4$:$O_2$=45 sccm:55 sccm:55 sccm); electric power, 3 kW; bias power, 140 W; and pressure, 0.67 Pa.

After that, a polyimide film was formed to a thickness of 1.5 μm by a coating method and subjected to a heat treatment at 300° C. under the atmospheric atmosphere for an hour.

Through the above process, the transistors of this example were formed.

Note that the transistor 622A, the transistor 622B, the transistor 628A, and the transistor 628B of this example were each formed so as to have a channel length (L) of 0.9 μm, a channel width (W) of 10 μm, and an offset length of 0.2 μm between the gate electrode layer and the electrode layer.

The results of the electric characteristic evaluation of the transistors which were formed are shown in FIGS. 13A and 13B and FIGS. 14A and 14B.

Figure 13A:
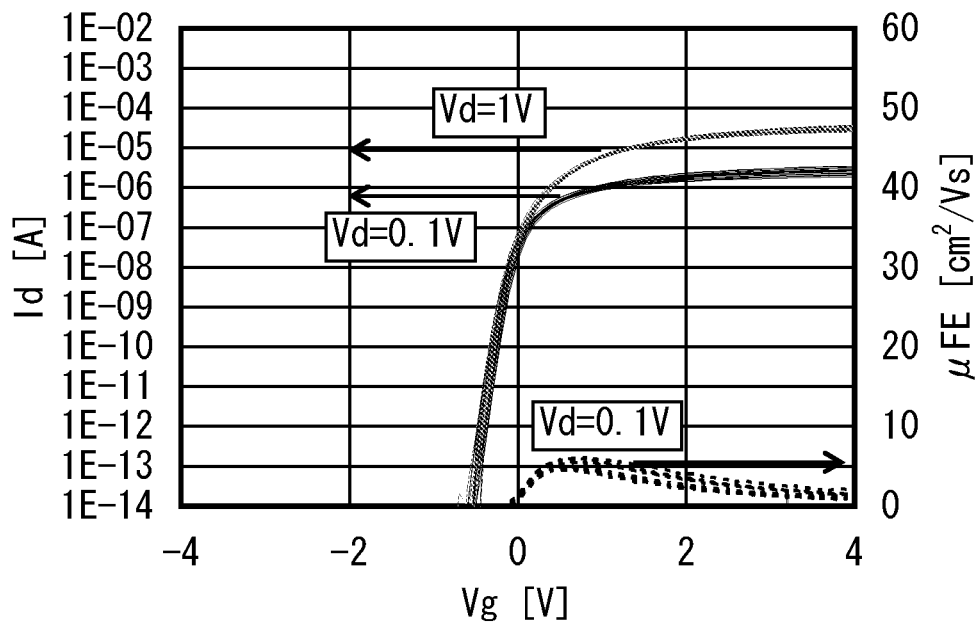
FIGS. 13A and 13B are graphs showing results of electric characteristic evaluation of transistors in Example.

FIG. 13A shows the result of the electric characteristic evaluation of the transistor 622A, specifically a gate voltage ($V_g$)-drain current ($I_d$) curve (curve plotted with gate voltage ($V_g$) as the horizontal axis and the logarithm of drain current ($I_d$) as the vertical axis) when drain voltage ($V_d$) was 1 V or 0.1 V, and field-effect mobility when the drain voltage ($V_d$) was 0.1V.

Figure 13B:
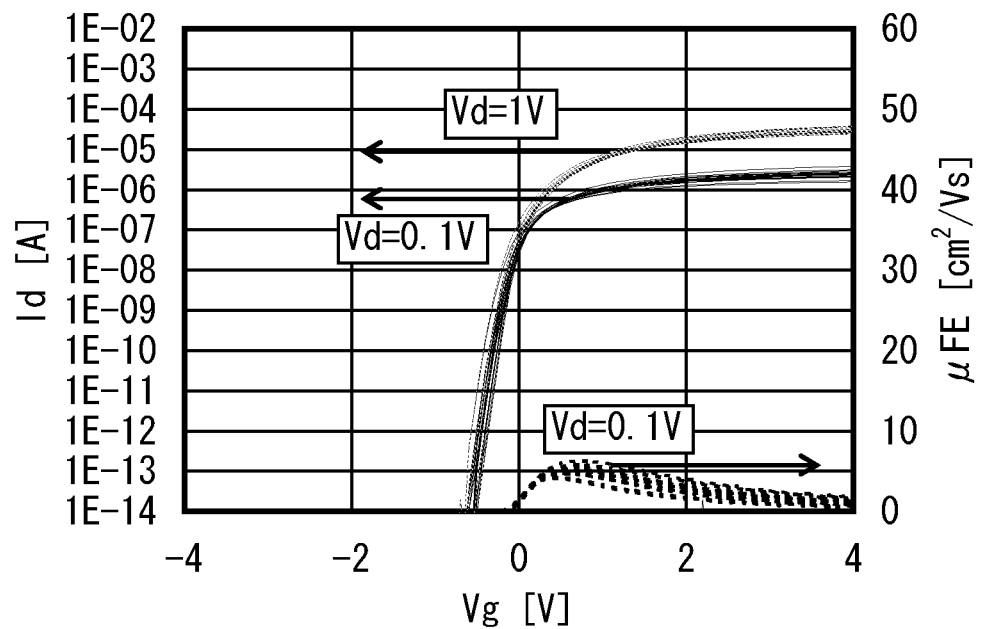

FIG. 13B shows the result of the electric characteristic evaluation of the transistor 622B, specifically a gate voltage ($V_g$)-drain current ($I_d$) curve when drain voltage ($V_d$) was 1 V or 0.1 V, and field-effect mobility when the drain voltage ($V_d$) was 0.1V.

Figure 14A:
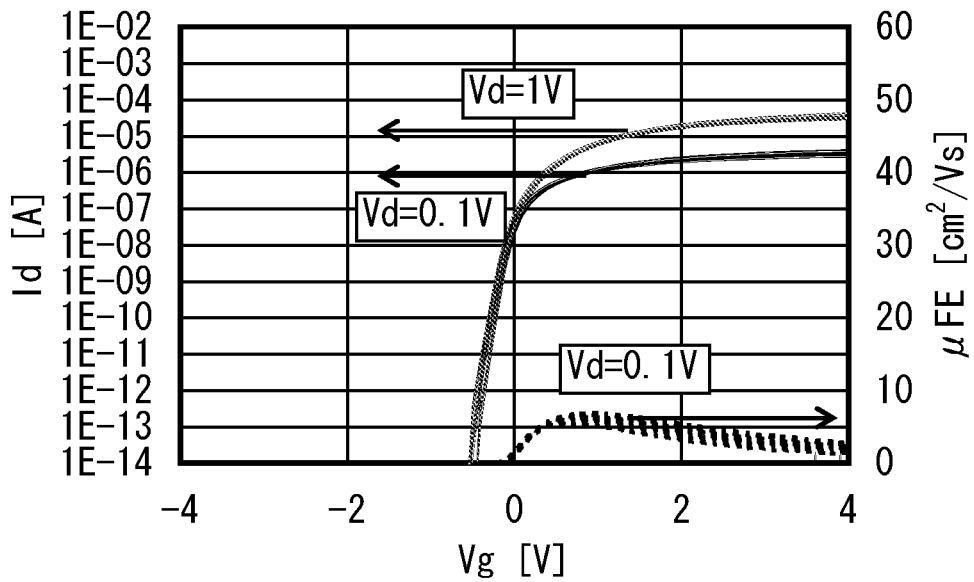
FIGS. 14A and 14B are graphs showing results of electric characteristic evaluation of transistors in Example.

FIG. 14A shows the result of the electric characteristic evaluation of the transistor 628A, in which the electrode layer 605 served as GND, specifically a gate voltage ($V_g$)-drain current ($I_d$) curve when drain voltage ($V_d$) was 1 V or 0.1 V, and field-effect mobility when the drain voltage ($V_d$) was 0.1V.

Figure 14B:
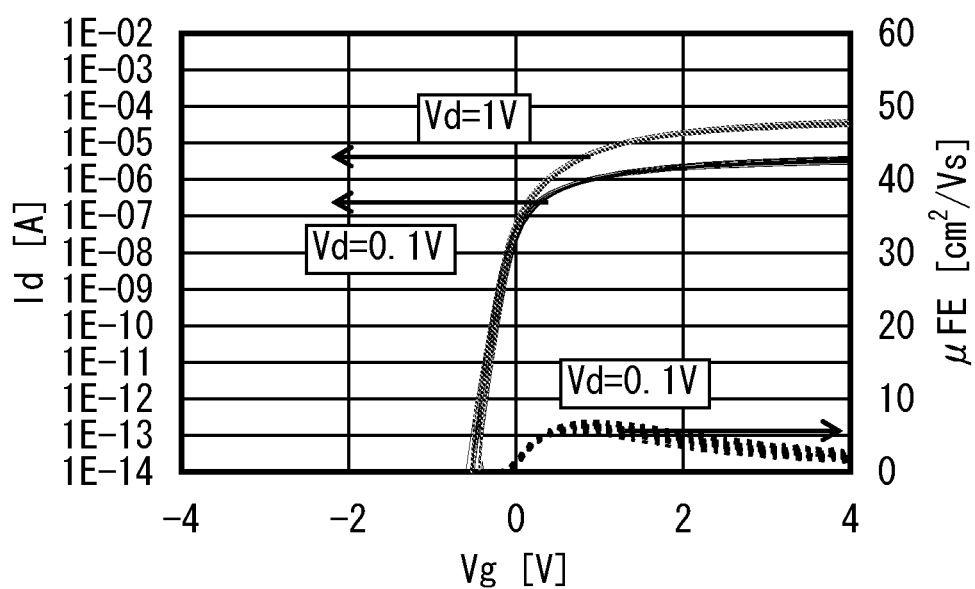

FIG. 14B shows the result of the electric characteristic evaluation of the transistor 628B, in which the wiring layer 665a served as GND, specifically a gate voltage ($V_g$)-drain current ($I_d$) curve when drain voltage ($V_d$) was 1 V or 0.1 V, and field-effect mobility when the drain voltage ($V_d$) was 0.1V.

As shown in FIGS. 13A and 13B and FIGS. 14A and 14B, the transistor 622A, transistor 622B, the transistor 628A, and transistor 628B of this example show electric characteristics as a switching element. The shift values when drain voltage ($V_d$) was 1 V were −0.45 V in the case of the transistor 622A, −0.41 V in the case of the transistor 622B, −0.40 V in the case of the transistor 628A, and −0.40 V in the case of the transistor 628B. Note that the shift value in this example refers to, in a gate voltage ($V_g$)-drain current ($I_d$) curve, a value of a gate voltage ($V_g$) at the intersection of a tangent having the highest inclination of the curve and a line representing a drain current ($I_d$) of $1 \times 10^{-12}$ A. Further, when drain voltage ($V_d$) was 0.1 V, the field-effect motilities were 5.3 cm²/Vs in the case of the transistor 622A, 5.5 cm²/Vs in the case of the transistor 622B, 6.2 cm²/Vs in the case of the transistor 628A, and 6.3 cm²/Vs in the case of the transistor 628B.

Further, when drain voltage was 1 V and gate voltage was 3V, the average values of on-state currents (sample number n=25) of the transistors in this example were 24.7 μA in the case of the transistor 622A, 24.3 μA in the case of the transistor 622B, 27.8 μA in the case of the transistor 628A, and 27.8 μA in the case of the transistor 628B.

The above results suggested that the transistors in this example had extremely high electric characteristics.

EXPLANATION OF REFERENCE

100: substrate, 102: oxide semiconductor layer, 103: oxide semiconductor layer, 106: element isolation insulating layer, 108: gate insulating layer, 110: gate electrode layer, 116: channel formation region, 120: impurity region, 124: intermetallic compound region, 130: insulating layer, 142a: source electrode layer, 142b: drain electrode layer, 144: oxide semiconductor layer, 144a: low-resistance region, 144b: low-resistance region, 144c: channel formation region, 146: gate insulating layer, 148a: gate electrode layer, 148b: conductive layer, 150: insulating layer, 152: insulating layer, 156a: wiring layer, 156b: wiring layer, 160: transistor, 162: transistor, 164: capacitor, 250: memory cell, 251a: memory cell array, 251b: memory cell array, 253: peripheral circuit, 254: capacitor, 400: substrate, 401: gate electrode layer, 402: gate insulating layer, 403: oxide semiconductor layer, 404a: low-resistance region, 404b: low-resistance region, 405: electrode layer, 405a: electrode layer, 405b: electrode layer, 407: insulating layer, 409: channel formation region, 415a: electrode layer, 415b: electrode layer, 420: transistor, 421: transistor, 422: transistor, 424: transistor, 426: transistor, 428: transistor, 431: dopant, 436: base insulating layer, 465a: wiring layer, 465b: wiring layer, 502: electrode, 504: electrode, 506: electrode, 508: capacitor line, 509: word line, 510: n-channel transistor, 512: p-channel transistor, 600: silicon substrate, 601: gate electrode layer, 602: gate insulating layer, 603: oxide semiconductor layer, 604a: low-resistance region, 604b: low-resistance region, 605: electrode layer, 605a: electrode layer, 605b: electrode layer, 607: insulating layer, 609: channel formation region, 622A: transistor, 622B: transistor, 628A: transistor, 628B: transistor, 632: insulating layer, 636: base insulating layer, 665a: wiring layer, 665b: wiring layer, 801: transistor, 803: transistor, 804: transistor, 805: transistor, 806: transistor, 807: X decoder, 808: Y decoder, 811: transistor, 812: storage capacitor, 813: X decoder, 814: Y decoder, 901: RF circuit, 902: analog baseband circuit, 903: digital baseband circuit, 904: battery, 905: power supply circuit, 906: application processor, 907: CPU, 908: DSP, 910: flash memory, 911: display controller, 912: memory circuit, 913: display, 914: display portion, 915: source driver, 916: gate driver, 917: audio circuit, 918: keyboard, 919: touch sensor, 950: memory circuit, 951: memory controller, 952: memory, 953: memory, 954: switch, 955: switch, 956: display controller, 957: display, 1001: battery, 1002: power supply circuit, 1003: microprocessor, 1004: flash memory, 1005: audio circuit, 1006: keyboard, 1007: memory circuit, 1008: touch panel, 1009: display, and 1010: display controller.

This application is based on Japanese Patent Application serial No. 2011-202963 filed with the Japan Patent Office on Sep. 16, 2011, the entire contents of which are hereby incorporated by reference.

The invention claimed is:

1. A semiconductor device comprising:
a base insulating layer;
a first conductive layer and a second conductive layer embedded in the base insulating layer;
an oxide semiconductor layer including a channel formation region, the oxide semiconductor layer provided on and in contact with the first conductive layer, the second conductive layer, and the base insulating layer;
a gate insulating layer over the oxide semiconductor layer;
a gate electrode layer over the channel formation region with the gate insulating layer therebetween;
an insulating layer over the gate insulating layer; and
a first wiring layer and a second wiring layer electrically connected to the first conductive layer and the second conductive layer, respectively, through openings provided in the insulating layer and the gate insulating layer,
wherein the openings do not overlap with the oxide semiconductor layer.

2. The semiconductor device according to claim 1, wherein the first wiring layer and the second wiring layer are in contact with the first conductive layer and the second conductive layer, respectively, through the openings provided in the insulating layer and the gate insulating layer.

3. The semiconductor device according to claim 1,
wherein the oxide semiconductor layer includes a pair of low-resistance regions,
wherein the channel formation region is between the pair of low-resistance regions, and
wherein in the pair of low-resistance regions, one low-resistance region is in contact with the first conductive layer and the other low-resistance region is in contact with the second conductive layer.

4. The semiconductor device according to claim 3, wherein the pair of low-resistance regions includes at least one of P, As, Sb, B, Al, N, Ar, He, Ne, In, F, Cl, Ti and Zn as a dopant.

5. The semiconductor device according to claim 1, wherein the oxide semiconductor layer includes indium, gallium, and zinc.

6. The semiconductor device according to claim 1, wherein the oxide semiconductor layer has crystallinity.

7. A memory cell comprising the semiconductor device according to claim 1.

8. A semiconductor device comprising:
a transistor, wherein a first channel formation region of the transistor comprises silicon;
a first insulating layer over the transistor;
a first conductive layer and a second conductive layer over the transistor;
an oxide semiconductor layer including a second channel formation region, the oxide semiconductor layer provided on and in contact with the first conductive layer, the second conductive layer, and the first insulating layer;
a gate insulating layer over the oxide semiconductor layer;
a gate electrode layer over the second channel formation region with the gate insulating layer therebetween;
a second insulating layer over the gate insulating layer; and
a first wiring layer and a second wiring layer electrically connected to the first conductive layer and the second conductive layer, respectively, through openings provided in the second insulating layer and the gate insulating layer,
wherein the openings do not overlap with the oxide semiconductor layer.

9. The semiconductor device according to claim 8,
wherein the oxide semiconductor layer includes a pair of low-resistance regions,
wherein the second channel formation region of the oxide semiconductor layer is between the pair of low-resistance regions, and
wherein in the pair of low-resistance regions, one low-resistance region is in contact with the first conductive layer and the other low-resistance region is in contact with the second conductive layer.

10. The semiconductor device according to claim 9, wherein the pair of low-resistance regions includes at least one of P, As, Sb, B, Al, N, Ar, He, Ne, In, F, Cl, Ti and Zn as a dopant.

11. The semiconductor device according to claim 8, wherein the oxide semiconductor layer includes indium, gallium, and zinc.

12. The semiconductor device according to claim 8, wherein the oxide semiconductor layer has crystallinity.

13. A memory cell comprising the semiconductor device according to claim 8.

14. The semiconductor device according to claim 8, wherein the first conductive layer and the second conductive layer are embedded in the first insulating layer.

* * * * *